United States Patent
Sugawara et al.

(10) Patent No.: US 12,384,876 B2
(45) Date of Patent: Aug. 12, 2025

(54) CHARGE-TRANSPORTING COMPOSITION

(71) Applicant: NISSAN CHEMICAL CORPORATION, Tokyo (JP)

(72) Inventors: Shun Sugawara, Funabashi (JP); Shinichi Maeda, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 1200 days.

(21) Appl. No.: 16/975,938

(22) PCT Filed: Mar. 6, 2019

(86) PCT No.: PCT/JP2019/008730
§ 371 (c)(1),
(2) Date: Aug. 26, 2020

(87) PCT Pub. No.: WO2019/176662
PCT Pub. Date: Sep. 19, 2019

(65) Prior Publication Data
US 2020/0411766 A1    Dec. 31, 2020

(30) Foreign Application Priority Data

Mar. 15, 2018  (JP) ................................ 2018-047507
Nov. 5, 2018   (JP) ................................ 2018-207945

(51) Int. Cl.
*H10K 85/40*    (2023.01)
*C08G 61/12*    (2006.01)
(Continued)

(52) U.S. Cl.
CPC ............ *C08G 61/126* (2013.01); *C08K 3/045* (2017.05); *C08K 3/36* (2013.01); *H10K 85/113* (2023.02);
(Continued)

(58) Field of Classification Search
CPC .... H01K 85/113; H01K 85/211; H01K 85/40; C08K 3/045; C08K 3/36; C08G 61/126
See application file for complete search history.

(56) References Cited

U.S. PATENT DOCUMENTS

2005/0040372 A1* 2/2005 Tahon ................... C09D 11/52
                                                        252/500
2007/0077478 A1* 4/2007 Nguyen ................ H01M 4/926
                                                        429/491
(Continued)

FOREIGN PATENT DOCUMENTS

CN    10463636 A     2/2017
EP    3 065 141 A1   9/2016
(Continued)

OTHER PUBLICATIONS

Riedel et al., Tailored Highly Transparent Composite Hole-Injection Layer Consisting of PEDOT:PSS and SiO2 Nanoparticles for Efficient Polymer Light-Emitting Diodes, Advanced Materials, vol./Issue 23, pp. 740-745 (Year: 2011).*

(Continued)

*Primary Examiner* — Jayne L Mershon
(74) *Attorney, Agent, or Firm* — Birch, Stewart, Kolasch & Birch, LLP

(57) ABSTRACT

Provided is a charge-transporting composition that contains: a charge-transporting substance comprising a polythiophene derivative represented by formula (1); a fluorine-based surfactant; metal oxide nanoparticles; and a solvent.

(Continued)

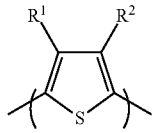

(1)

($R^1$ and $R^2$ are each independently a hydrogen atom, an alkoxy group having 1-40 carbon atoms, —O—[Z—O]$_p$—$R^e$, a sulfonic acid group, or the like, or $R^1$ and $R^2$ bond to each other to form —O—Y—O—. Y is an alkylene group having 1-40 carbon atoms, which may contain an ether bond and which may be substituted with a sulfonic acid group. Z is an alkylene group having 1-40 carbon atoms, which may be substituted with a halogen atom. p is 1 or more, and $R^e$ is a hydrogen atom, an alkyl group having a 1-40 carbon atoms, or the like.)

21 Claims, 1 Drawing Sheet

(51) Int. Cl.
| | | |
|---|---|---|
| *C08K 3/04* | (2006.01) | |
| *C08K 3/36* | (2006.01) | |
| *H10K 30/30* | (2023.01) | |
| *H10K 30/50* | (2023.01) | |
| *H10K 85/10* | (2023.01) | |
| *H10K 85/20* | (2023.01) | |
| *B82Y 30/00* | (2011.01) | |
| *B82Y 40/00* | (2011.01) | |

(52) U.S. Cl.
CPC ........... *H10K 85/211* (2023.02); *H10K 85/40* (2023.02); *B82Y 30/00* (2013.01); *B82Y 40/00* (2013.01); *H10K 30/30* (2023.02); *H10K 30/50* (2023.02)

(56) References Cited

U.S. PATENT DOCUMENTS

| | | |
|---|---|---|
| 2008/0029742 A1 | 2/2008 | Yoshimoto et al. |
| 2008/0246853 A1 | 10/2008 | Takizawa et al. |
| 2008/0258612 A1 | 10/2008 | Kim et al. |
| 2009/0140635 A1 | 6/2009 | Shinohara |
| 2009/0148722 A1 | 6/2009 | Louwet |
| 2015/0289567 A1 | 9/2015 | Tamai et al. |
| 2015/0279503 A1 | 10/2015 | Scheel et al. |
| 2016/0056397 A1* | 2/2016 | Schumann ........... H10K 30/865 252/500 |
| 2017/0104161 A1 | 4/2017 | Otani |

FOREIGN PATENT DOCUMENTS

| | | |
|---|---|---|
| EP | 3 073 494 A1 | 9/2016 |
| JP | 2003-234460 A | 8/2003 |
| JP | 2008-302927 A | 11/2006 |
| JP | 2008-258474 A | 10/2008 |
| JP | 2008-270170 A | 11/2008 |
| JP | 2012-191194 A | 10/2012 |
| JP | 2015-172124 A | 10/2015 |
| JP | 2017-86260 A | 5/2017 |
| KR | 10-2005-0117851 A | 12/2005 |
| TW | 200615254 A | 5/2006 |
| TW | 201426786 A | 7/2014 |
| WO | WO 03/048229 A1 | 6/2003 |
| WO | WO 2005/093872 A1 | 10/2005 |
| WO | WO 2008/055834 A1 | 5/2008 |
| WO | WO 2010/124166 A2 | 10/2010 |
| WO | WO 2017/014946 A1 | 1/2017 |
| WO | WO 2017/115467 A1 | 7/2017 |

OTHER PUBLICATIONS

Chinese Office Action and Search Report for Chinese Application No. 201980019166.9 dated Jun. 15, 2023.
International Search Report (PCT/ISA/210) issued in PCT/JP2019/008730 mailed on May 28, 2019.
Li et al., "Polymer solar cells", Nature Photonics, 2012, vol. 6, pp. 153-161.
Lim et al., "Organic-on-silicon complementary metal-oxide-semiconductor colour image sensors", Scientific Reports, 2015, vol. 5, No. 7708, pp. 1-7.
O'Regan et al., "A low-cost, high-efficiency solar cell based on dye-sensitized colloidal TiO2 films", Nature 1991, vol. 353, pp. 737-740.
Tang, "Two-layer organic photovoltaic cell", Appl. Phys. Lett., 1986, vol. 48, No. 2, pp. 183-185.
Written Opinion (PCT/ISA/237) issued in PCT/JP2019/008730 mailed on May 28, 2019.
Taiwanese Office Action and Search Report for Taiwanese Application No. 108108374, dated Oct. 20, 2022.
Extended European Search report issued Nov. 4, 2021, in European Patent Application No. 19768297.4.
Riedel et al., "Tailored Highly Transparent Composite Hole-Injection Layer Consisting of Pedot:PSS and SiO2 Nanoparticles for Efficient Polymer Light-Emitting Diodes," Advanced Materials, vol. 23, 2011, pp. 740-745.
Taiwanese Office Action and Search Report for Taiwanese Application No. 108108374, dated Sep. 11, 2024.

* cited by examiner

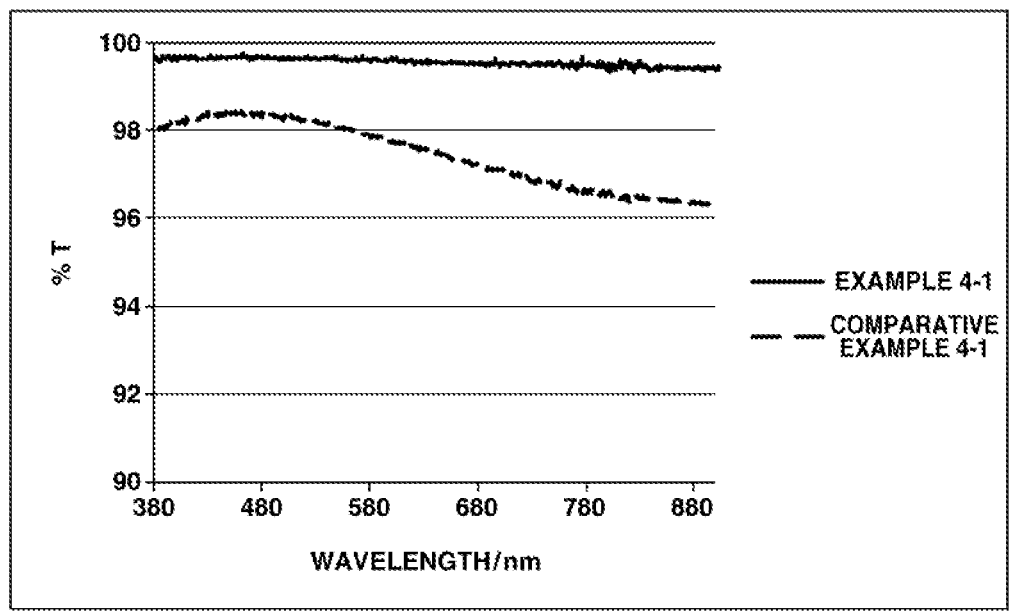

CHARGE-TRANSPORTING COMPOSITION

TECHNICAL FIELD

The present invention relates to a charge-transporting composition, and more specifically to a charge-transporting composition suitable for formation of a hole collection layer in an organic photoelectric conversion element.

BACKGROUND ART

An electronic element, particularly an organic photoelectric conversion element is a device which converts light energy into electric energy by use of an organic semiconductor, and examples thereof include organic solar cells.

The organic solar cell is a solar cell element in which an organic substance is used for an active layer and a charge-transporting substance, and a dye-sensitized solar cell developed by M. Gratzel and an organic thin-film solar cell developed by C W Tang are well known (Non-Patent Documents 1 and 2).

Both the cells are lightweight and thin, and have features different from those of currently prevailing inorganic solar cells in that the cells can be made flexible and produced through a roll-to-roll process. Therefore, formation of a new market is expected.

Among them, the organic thin-film solar cell has been attracted a lot of attention because the cell has the features of being free from electrolytes and free from metal compounds, and has been recently reported to have a photoelectric conversion efficiency (hereinafter, abbreviated as PCE) of 10.6% by groups in UCLA etc. (Non-Patent Document 3).

On the other hand, in contrast to a photoelectric conversion element in which a conventional silicon-based material is used, the organic thin-film solar cell has features such that high photoelectric conversion efficiency is exhibited even at a low illuminance, it is possible to thin the element and make pixels finer, and it is possible to also have the properties of a color filter, and therefore the organic thin-film solar cell has received attention not only as a solar cell but also as an optical sensor such as an image sensor (Patent Documents 1 and 2 and Non-Patent Document 4). Hereinafter, the "organic photoelectric conversion element (hereinafter, sometimes referred to as OPV)" is a collective term which refers not only to organic solar cells (dye-sensitized solar cell and organic thin-film solar cell) but also optical sensors and the like.

The organic photoelectric conversion element includes an active layer (photoelectric conversion layer), a charge (hole or electron) collection layer, electrodes (anode, cathode) and the like.

Among them, the active layer and the charge collection layer are generally formed by a vacuum evaporation method, and the vacuum deposition method has problems regarding complexity associated with mass productions, increased costs of apparatuses, material utilization efficiency and the like.

From these reasons, a water-dispersible polymer organic conductive material such as PEDOT/PSS may be used as a coating material for a hole collection layer, but the PEDOT/PSS aqueous dispersion has insufficient heat resistance in addition to the problem that defects are easily generated in a coating film and a coating apparatus is easily clogged and corroded because of the property of allowing solid contents to easily aggregate. Thus, there remain various problems in mass production.

PRIOR ART DOCUMENTS

Patent Documents

Patent Document 1: JP-A 2003-234460
Patent Document 2: JP-A 2008-258474

Non-Patent Documents

Non-Patent Document 1: Nature, vol. 353, 737-740 (1991)
Non-Patent Document 2: Appl. Phys. Lett., Vol. 48, 183-185 (1986)
Non-Patent Document 3: Nature Photonics Vol. 6, 153-161 (2012)
Non-Patent Document 4: Scientific Reports, Vol. 5: 7708, 1-7 (2015)

SUMMARY OF INVENTION

Technical Problem

The present invention has been made in view of the above-described circumstances, and an object of the present invention is to provide a charge-transporting composition which gives a thin film suitable as a hole collection layer of an organic photoelectric conversion element and excellent in transparency and adhesion with the active layer, and which is particularly suitable for preparation of a reversely layered organic photoelectric conversion element.

Solution to Problem

The present inventors have extensively conducted studies for achieving the above-described object, and resultantly found that a polythiophene derivative containing predetermined repeating units has high hole-transportability, and has high solubility in a protonic polar solvent having low corrosiveness to an active layer, such as alcohol or water, to the extent that a homogeneous solution is formed, and when a thin film is formed from the solution by a coating step, and used as a hole collection layer of an OPV element, an OPV element having good PCE is obtained with a high yield; that addition of an electron-accepting dopant substance mainly composed of Broensted acid having high oxidizing power at the time of preparing the solution enables control of the resulting thin film at a HOMO level, so that it is possible to efficiently collect and transport holes, and as a result, an OPV element can be obtained which has high PCE and exhibits high durability; that further addition of metal oxide nanoparticles to the solution enables improvement of transparency of the resulting thin film and adhesion of the thin film with the active layer; and that by adding a fluorine-based surfactant to the solution, a charge-transporting composition can be obtained which is excellent in formability of a film on the active layer and suitable for preparation of a reversely layered organic photoelectric conversion element. In this way, the present invention has been completed.

That is, the present invention provides:

1. a charge-transporting composition including: a charge-transporting substance including a polythiophene derivative containing repeating units represented by the formula (1); a fluorine-based surfactant; metal oxide nanoparticles; and a solvent:

[Chem. 1]

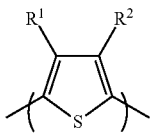
(1)

wherein $R^1$ and $R^2$ are each independently a hydrogen atom, an alkyl group having 1 to 40 carbon atoms, a fluoroalkyl group having 1 to 40 carbon atoms, an alkoxy group having 1 to 40 carbon atoms, a fluoroalkoxy group having 1 to 40 carbon atoms, an aryloxy group having 6 to 20 carbon atoms, —O—[Z—O]$_p$—$R^e$, or a sulfonic acid group, or $R^1$ and $R^2$ are combined to form —O—Y—O—, Y is an alkylene group having 1 to 40 carbon atoms, optionally containing an ether bond and optionally substituted with a sulfonic acid group, and Z is an alkylene group having 1 to 40 carbon atoms and optionally substituted with a halogen atom, p is 1 or more, and $R^e$ is a hydrogen atom, an alkyl group having 1 to 40 carbon atoms, a fluoroalkyl group having 1 to 40 carbon atoms, or an aryl group having 6 to 20 carbon atoms;

2. the charge-transporting composition according to 1, wherein the metal oxide nanoparticles are $SiO_2$;
3. the charge-transporting composition according to 2, wherein $SiO_2$ is silica sol;
4. the charge-transporting composition according to any one of 1 to 3, wherein the fluorine-based surfactant is a fluorine-based nonionic surfactant;
5. the charge-transporting composition according to 4, wherein the fluorine-based nonionic surfactant is at least one selected from compounds of the following formulae (A2) and (B2):

[Chem. 2]

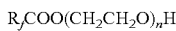 (A2)

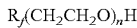 (B2)

wherein $R_f$ is each independently represent a perfluoroalkyl group having 1 to 40 carbon atoms, and n is each independently represent an integer of 1 to 20;

6. the charge-transporting composition according to any one of 1 to 5, wherein $R^1$ is a sulfonic acid group, $R^2$ is an alkoxy group having 1 to 40 carbon atoms or —O—[Z—O]$_p$—$R^e$, or $R^1$ and $R^2$ are combined to form —O—Y—O—;
7. the charge-transporting composition according to any one of 1 to 6, further including an electron-accepting dopant substance different from the polythiophene derivative containing repeating units represented by the formula (1);
8. the charge-transporting composition according to 7, wherein the electron-accepting dopant substance is Broensted acid;
9. the charge-transporting composition according to 8, wherein the electron-accepting dopant substance is an arylsulfonic acid compound;
10. the charge-transporting composition according to any one of 1 to 9, wherein the solvent contains one or more solvents selected from an alcohol-based solvent and water;
11. the charge-transporting composition according to any one of 1 to 10, wherein the charge-transporting composition is one for a hole collection layer of an organic photoelectric conversion element;
12. the charge-transporting composition according to 11, wherein the organic photoelectric conversion element is an organic thin-film solar cell, a dye-sensitized solar cell or an optical sensor;
13. a thin film obtained from the charge-transporting composition of any one of 1 to 10;
14. the thin film according to 13, wherein the thin film is a hole collection layer of an organic photoelectric conversion element;
15. an electronic element including the thin film of 13 or 14;
16. the electronic element according to 15, wherein the electronic element is an organic photoelectric conversion element;
17. an organic photoelectric conversion element including the hole collection layer of 14, and an active layer provided so as to contact the hole collection layer;
18. the organic photoelectric conversion element according to 17, wherein the active layer contains a fullerene derivative;
19. the organic photoelectric conversion element according to 17, wherein the active layer contains a polymer containing a thiophene backbone as a main chain;
20. the organic photoelectric conversion element according to 17, wherein the active layer contains a fullerene derivative, and a polymer containing a thiophene backbone as a main chain;
21. the organic photoelectric conversion element according to any one of 17 to 20, which is a reversely layered organic photoelectric conversion element;
22. the organic photoelectric conversion element according to any one of 17 to 21, wherein the organic photoelectric conversion element is an organic thin-film solar cell or an optical sensor;
23. the organic photoelectric conversion element according to 22, which has a top anode structure;
24. a composition for a hole collection layer of an organic photoelectric conversion element, including: a charge-transporting substance including a polythiophene derivative containing repeating units represented by the formula (1); metal oxide nanoparticles, and a solvent:

[Chem. 3]

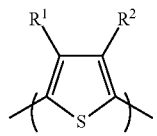
(1)

wherein $R^1$ and $R^2$ are each independently a hydrogen atom, an alkyl group having 1 to 40 carbon atoms, a fluoroalkyl group having 1 to 40 carbon atoms, an alkoxy group having 1 to 40 carbon atoms, a fluoroalkoxy group having 1 to 40 carbon atoms, an aryloxy group having 6 to 20 carbon atoms, —O—[Z—O]$_p$—$R^e$ or a sulfonic acid group, or $R^1$ and $R^2$ are combined to form —O—Y—O—, Y is an alkylene group having 1 to 40 carbon atoms, optionally containing an ether bond and optionally substituted with a sulfonic acid group, and Z is an alkylene group having 1 to 40 carbon atoms and optionally substituted with a halogen atom, p is 1 or more, and $R^e$ is a hydrogen atom, an alkyl group having 1 to 40 carbon atoms, a fluoroalkyl group having 1 to 40 carbon atoms, or an aryl group having 6 to 20 carbon atoms;

25. the composition for a hole collection layer of an organic photoelectric conversion element according to 24, further including an electron-accepting dopant substance different from the polythiophene derivative containing repeating units represented by the formula (1);
26. the composition for a hole collection layer of an organic photoelectric conversion element according to 24 or 25, wherein the metal oxide nanoparticles are $SiO_2$;
27. the composition for a hole collection layer of an organic photoelectric conversion element according to 26, wherein $SiO_2$ is silica sol;
28. the composition for a hole collection layer of an organic photoelectric conversion element according to any one of 25 to 27, wherein the electron-accepting dopant substance different from the polythiophene derivative containing repeating units represented by the formula (1) is an arylsulfonic acid compound;
29. a hole collection layer obtained from the composition for a hole collection layer of an organic photoelectric conversion element in any one of 24 to 28; and
30. an organic photoelectric conversion element including the hole collection layer of 29.

Advantageous Effects of Invention

The charge transporting composition of an organic photoelectric conversion element according to the present invention can be produced by use of a charge-transporting substance including a polythiophene derivative which can be obtained at low price on the market or conveniently synthesized by a known method. Further, an organic thin-film solar cell excellent in PCE can be obtained when a thin film obtained from the charge-transporting composition is used as a hole collection layer. In addition, use of the charge-transporting composition of the present invention enables formation of a high-uniformity thin film, and by using the high-uniformity thin film as a hole collection layer, current leakage can be suppressed to keep the reverse bias dark current low. Therefore, by applying a thin film formed from the charge-transporting composition of the present invention to an element structure similar to the organic thin-film solar cell, a slight amount of photons can be converted into electrons and detected. Thus, a hole collection layer obtained from the composition is also applicable to optical sensors such as high-performance image sensors.

In addition, the charge-transporting substance including a polythiophene derivative for use in the present invention is excellent in solubility in a protic polar solvent such as alcohol or water, and enables a composition to be prepared using a solvent unlikely to adversely affect the active layers. Moreover, the charge-transporting substance can be easily deposited on the active layer because it contains a fluorine-based surfactant, and the charge-transporting substance is excellent in transparency and adhesion with the active layer because it contains metal oxide nanoparticles. Thus, the charge-transporting substance is also suitable for preparation of reversely layered organic thin-film solar cell.

Further, by adding an electron-accepting dopant substance including Broensted acid, an OPV element can be obtained which has higher PCE and exhibits high durability.

BRIEF DESCRIPTION OF DRAWINGS

FIG. 1 is a graph showing transmittances measured in Example 4-1 and Comparative Example 4-1.

DESCRIPTION OF EMBODIMENTS

The present invention is described in more detail below.

The charge-transporting composition of the present invention includes a charge-transporting substance including a polythiophene derivative containing repeating units represented by the formula (1); a fluorine-based surfactant, metal oxide nanoparticles, and a solvent.

[Chem. 4]

(1)

In the formula, $R^1$ and $R^2$ are each independently a hydrogen atom, an alkyl group having 1 to 40 carbon atoms, a fluoroalkyl group having 1 to 40 carbon atoms, an alkoxy group having 1 to 40 carbon atoms, a fluoroalkoxy group having 1 to 40 carbon atoms, an aryloxy group having 6 to 20 carbon atoms, —O—[Z—O]$_p$—$R^e$ or a sulfonic acid group, or $R^1$ and $R^2$ are combined to form —O—Y—O—, Y is an alkylene group having 1 to 40 carbon atoms, optionally containing an ether bond and optionally substituted with a sulfonic acid group, and Z is an alkylene group having 1 to 40 carbon atoms and optionally substituted with a halogen atom, p is 1 or more, and $R^e$ is a hydrogen atom, an alkyl group having 1 to 40 carbon atoms, a fluoroalkyl group having 1 to 40 carbon atoms, or an aryl group having 6 to 20 carbon atoms.

The alkyl group having 1 to 40 carbon atoms may be linear, branched or cyclic, and specific examples thereof include a methyl group, an ethyl group, an n-propyl group, an isopropyl group, an n-butyl group, an isobutyl group, an s-butyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosanyl group, a behenyl group, a triacontyl group and a tetracontyl group. The alkyl group is preferably an alkyl group having 1 to 18 carbon atoms, more preferably an alkyl group having 1 to 8 carbon atoms.

Examples of the fluoroalkyl group having 1 to 40 carbon atoms include groups in which at least one hydrogen atom is replaced by a fluorine atom in the above-described alkyl group having 1 to 40 carbon atoms. Such groups are not particularly limited, and examples thereof include a difluoromethyl group, a trifluoromethyl group, a perfluoropropenyl group, a 1H,1H,2H,2H-perfluorooctyl group, a perfluoroethyl group and —$CH_2CF_3$.

The alkyl group in the alkoxy group having 1 to 40 carbon atoms may be linear, branched or cyclic, and examples thereof include a methoxy group, an ethoxy group, an n-propoxy group, an i-propoxy group, a c-propoxy group, an n-butoxy group, an i-butoxy group, an s-butoxy group, a t-butoxy group, an n-pentoxy group, an n-hexoxy group, an n-heptyloxy group, an n-octyloxy group, an n-nonyloxy group, an n-decyloxy group, an n-undecyloxy group, an n-dodecyloxy group, an n-tridecyloxy group, an n-tetradecyloxy group, an n-pentadecyloxy group, an n-hexadecyloxy group, an n-heptadecyloxy group, an n-octadecyloxy group, an n-nonadecyloxy group and an n-eicosanyloxy group.

The fluoroalkoxy group having 1 to 40 carbon atoms is not particularly limited, provided that it is an alkoxy group in which at least one hydrogen atom on a carbon atom is substituted with a fluorine atom. Examples thereof include fluoromethoxy, difluoromethoxy, trifluoromethoxy, 1-fluoroethoxy, 2-fluoroethoxy, 1,2-difluoroethoxy, 1,1-difluoroethoxy, 2,2-difluoroethoxy, 1,1,2-trifluoroethoxy, 1,2,2-trifluoroethoxy, 2,2,2-trifluoroethoxy, 1,1,2,2-tetrafluoroethoxy, 1,2,2,2-tetrafluoroethoxy, 1,1,2,2,2-pentafluoroethoxy, 1-fluoropropoxy, 2-fluoropropoxy, 3-fluoropropoxy, 1,1-difluoropropoxy, 1,2-difluoropropoxy, 1,3-difluoropropoxy, 2,2-difluoropropoxy, 2,3-difluoropropoxy, 3,3-difluoropropoxy, 1,1,2-trifluoropropoxy, 1,1,3-trifluoropropoxy, 1,2,3-trifluoropropoxy, 1,3,3-trifluoropropoxy, 2,2,3-trifluoropropoxy, 2,3,3-trifluoropropoxy, 3,3,3-trifluoropropoxy, 1,1,2,2-tetrafluoropropoxy, 1,1,2,3-tetrafluoropropoxy, 1,2,2,3-tetrafluoropropoxy, 1,3,3,3-tetrafluoropropoxy, 2,2,3,3-tetrafluoropropoxy, 2,3,3,3-tetrafluoropropoxy, 1,1,2,2,3-pentafluoropropoxy, 1,2,2,3,3-pentafluoropropoxy, 1,1,3,3,3-pentafluoropropoxy, 1,2,3,3,3-pentafluoropropoxy, 2,2,3,3,3-pentafluoropropoxy and heptafluoropropoxy groups.

The alkylene group having 1 to 40 carbon atoms may be linear, branched or cyclic, and examples thereof include, but are not limited to, a methylene group, an ethylene group, a propylene group, a trimethylene group, a tetramethylene group, a pentylene group, a hexylene group, a heptylene group, an octylene group, a nonylene group, a decylene group, an undecylene group, a dodecylene group, a tridecylene group, a tetradecylene group, a pentadecylene group, a hexadecylene group, a heptadecylene group, an octadecylene group, a nonadecylene group and an eicosanylene group.

Examples of the aryl group having 6 to 20 carbon atoms include a phenyl group, a tolyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group and a 9-phenanthryl group, and a phenyl group, a tolyl group and a naphthyl group are preferable.

Examples of the aryloxy group having 6 to 20 carbon atoms include, but are not limited to, a phenoxy group, an anthracenoxy group, a naphthoxy group, a phenanthrenoxy group and a fluorenoxy group.

Examples of the halogen atom include fluorine, chlorine, bromine and iodine atoms.

The polythiophene derivative containing repeating units represented by the formula (1) is preferably one in which $R^1$ and $R^2$ are each independently a hydrogen atom, a fluoroalkyl group having 1 to 40 carbon atoms, an alkoxy group having 1 to 40 carbon atoms, $-O[C(R^aR^b)-C(R^cR^d)-O]_p-R^e$, $-OR^f$ or a sulfonic acid group, or $R^1$ and $R^2$ are combined to form $-O-Y-O-$. $R^a$ to $R^d$ each independently represent a hydrogen atom, an alkyl group having 1 to 40 carbon atoms, a fluoroalkyl group having 1 to 40 carbon atoms, or an aryl group having 6 to 20 carbon atoms. $R^e$ is the same as described above. p is preferably 1, 2 or 3. $R^f$ is preferably an alkyl group having 1 to 40 carbon atoms, a fluoroalkyl group having 1 to 40 carbon atoms, or an aryl group having 6 to 20 carbon atoms.

In particular, it is preferable that $R^a$ to $R^d$ are each independently a hydrogen atom, an alkyl group having 1 to 8 carbon atoms, a fluoroalkyl group having 1 to 8 carbon atoms, or a phenyl group. It is preferable that $R^e$ and $R^f$ are each independently a hydrogen atom, an alkyl group having 1 to 8 carbon atoms, a fluoroalkyl group having 1 to 8 carbon atoms, or a phenyl group, $R^e$ is more preferably a hydrogen atom, a methyl group, a propyl group or a butyl group is more preferable, and $R^f$ is more preferably $-CH_2CF_3$.

$R^1$ is preferably a hydrogen atom or a sulfonic acid group, more preferably a sulfonic acid group. $R^2$ is preferably an alkoxy group having 1 to 40 carbon atoms, or $-O-[Z-O]_p-R^e$, more preferably $-O[C(R^aR^b)-C(R^cR^d)-O]_p-R^e$ or $OR^f$, still more preferably $-O[C(R^aR^b)-C(R^cR^d)-O]_p-R^e$, even more preferably $-O-CH_2CH_2O-CH_2CH_2O-CH_3$, $-O-CH_2CH_2-O-CH_2CH_2-OH$ or $-O-CH_2CH_2-OH$.

In addition, it is preferable that $R^1$ and $R^2$ are combined to form $-O-Y-O-$.

A preferred aspect of the polythiophene derivative is, for example, a polythiophene derivative containing repeating units in which $R^1$ is a sulfonic acid group and $R^2$ is not a sulfonic acid group.

A preferred aspect of the polythiophene derivative is, for example, a polythiophene derivative containing repeating units in which $R^1$ is a sulfonic acid group and $R^2$ is an alkoxy group having 1 to 40 carbon atoms, or $-O-[Z-O]_p-R^e$, or a polythiophene derivative containing repeating units in which $R^1$ and $R^2$ are combined to form $-O-Y-O-$.

Another preferred aspect of the polythiophene derivative is, for example, a polythiophene derivative containing repeating units in which $R^1$ is a sulfonic acid group and $R^2$ is $-O[C(R^aR^b)-C(R^cR^d)-O]_p-R^e$ or $OR^f$.

Still another preferred aspect of the polythiophene derivative is, for example, a polythiophene derivative containing repeating units in which $R^1$ is a sulfonic acid group and $R^2$ is $-O[C(R^aR^b)-C(R^cR^d)-O]_p-R^e$.

Still another preferred aspect of the polythiophene derivative is, for example, a polythiophene derivative containing repeating units in which $R^1$ is a sulfonic acid group and $R^2$ is $-O-CH_2CH_2-O-CH_2CH_2-O-CH_3$, $-O-CH_2CH_2-O-CH_2CH_2-OH$ or $-O-CH_2CH_2-OH$, or a polythiophene derivative containing repeating units in which $R^1$ and $R^2$ are groups represented by the following formula (Y1) and/or formula (Y2).

[Chem. 5]

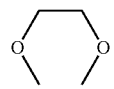
(Y1)

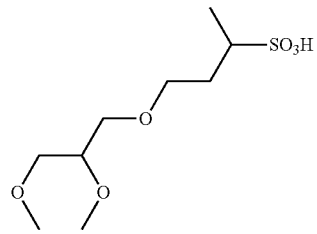
(Y2)

Specific preferred examples of the polythiophene derivative include polythiophene containing at least one of repeating units represented by the following formulae (1-1) to (1-5).

[Chem. 6]

(1-1)
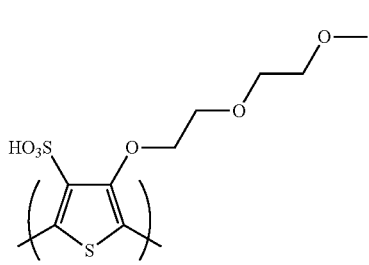

(1-2)
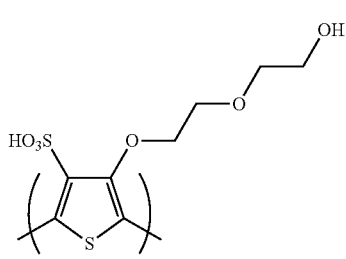

(1-3)
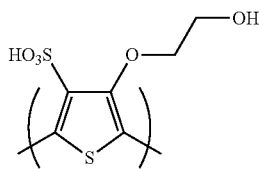

(1-4)
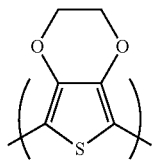

(1-5)
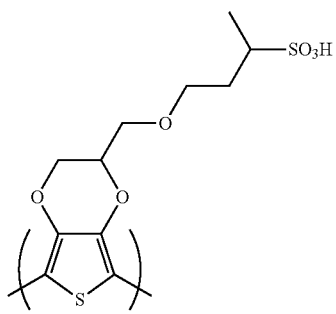

In addition, the polythiophene derivative is not necessarily required to have sulfonic acid groups in all repeating units. Therefore, it is not necessary that all the repeating units have the same structure, and the repeating units may contain different structures. Examples of the structure include polythiophene derivatives having a structure represented by the following formula (1a). In the following formula, units may be combined at random or as a block polymer.

[Chem. 7]

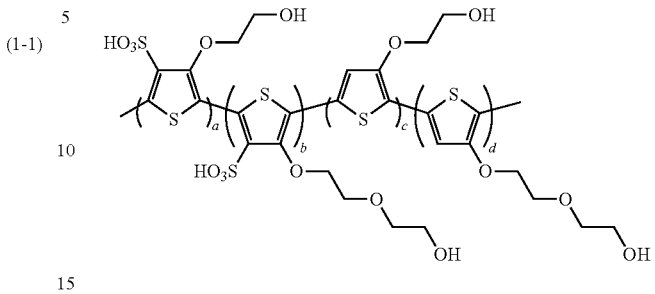

(1a)

In the formula, a to d represent the molar ratios of the units, respectively, and satisfy the requirements of $0 \leq a \leq 1$, $0 \leq b \leq 1$, $0 < a+b \leq 1$, $0 \leq c < 1$, $0 \leq d < 1$ and $a+b+c+d=1$.

Further, the polythiophene derivative may be a homopolymer or a copolymer (including statistical, random, gradient and block copolymers). Examples of the polymer containing the monomer A and the monomer B include A-B diblock copolymers, A-B-A triblock copolymers and $(AB)_m$-multiblock copolymers. The polythiophene may contain repeating units derived from other types of monomers (e.g. thienothiophene, selenophene, pyrrole, furan, tellurophene, aniline, arylamine, and arylene such as phenylene, phenylenevinylene or fluorene).

In the present invention, the content of the repeating units represented by the formula (1) in the polythiophene derivative is preferably more than 50 wt %, more preferably more than 80 wt %, still more preferably more than 90 wt %, even more preferably more than 95 wt %, most preferably 100 wt %, based on the total weight of repeating units.

In the present invention, depending on the purity of a starting monomer compound used for polymerization, the polymer formed may contain repeating units derived from impurities. In the present invention, the term "homopolymer" described above means a polymer containing repeating units derived from one type of monomer, but the homopolymer may contain repeating units derived from impurities. In the present invention, the polythiophene derivative is preferably a homopolymer in which all repeating units are basically repeating units represented by the formula (1), and the polythiophene derivative is more preferably a homopolymer in which the repeating units represented by any of the formulae (1-1) to (1-5).

In the present invention, the polythiophene derivative may be used after being treated with a reducing agent.

In the polythiophene derivative, the chemical structure of some of the repeating units forming the polythiophene derivative may be an oxidation-type structure called a "quinoid structure". The term "quinoid structure" is used with respect to the term "benzenoid structure", and the latter is a structure including an aromatic ring, whereas the former means a structure in which a double bond within the aromatic ring moves out of the ring (as a result, the aromatic ring disappears), leading to formation of two exocyclic double bonds conjugated with other double bonds remaining in the ring. Those skilled in the art can easily understand the relationship between these two structures from the relationship between the structures of benzoquinone and hydroquinone. Quinoid structures of repeating units in various conjugated polymers are well known to those skilled in the art. As an example, a quinoid structure corresponding to the repeating units of the polythiophene derivative represented by the above formula (1) is shown in the following formula (1').

[Chem. 8]

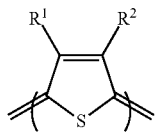

(1')

In the formula (1'), $R^1$ and $R^2$ are as defined in the formula (1).

The quinoid structure is generated by a process in which a polythiophene derivative containing repeating units represented by the formula (1) is subjected to oxidation reaction by a dopant, i.e. doping reaction. The quinoid structure forms a part of a structure called a "polaron structure" or "bipolaron structure" which imparts charge-transportability to the polythiophene. These structures are known. In preparation of an organic EL element, introduction of the "polaron structure" and/or the "bipolaron structure" is essential. In fact, at the time when a thin film formed from a charge-transporting composition is subjected to baking treatment during preparation of an organic EL element, the introduction of the structure is achieved by intentionally causing the doping reaction to take place. The reason why polythiophene before the doping reaction takes place includes a quinoid structure may be that polythiophene undergoes unintended oxidation reaction similar to the doping reaction in a process for producing the polythiophene (particularly in a sulfonation step in the process).

There is a correlation between the amount of the quinoid structure contained in the polythiophene and the dispersibility of the polythiophene in an organic solvent, and the dispersibility tends to decrease as the amount of the quinoid structure increases. Therefore, introduction of the quinoid structure after formation of the thin film from the charge-transporting composition does not cause a problem, but if the quinoid structure is excessively introduced into the polythiophene due to the unintentional oxidation reaction, production of the charge-transporting composition may be hindered. Polythiophene is known to have a variation in dispersibility in the organic solvent, and one of the causes may be that the amount of the quinoid structure introduced into the polythiophene by the unintentional oxidation reaction varies depending on a difference between the conditions for production of respective polythiophenes.

Thus, when the polythiophene is subjected to reduction treatment using a reducing agent, the amount of the quinoid structure decreases due to reduction to improve the dispersibility in the organic solvent of the polythiophene even if the quinoid structure is excessively introduced in the polythiophene. Therefore, it is possible to stably produce a charge-transporting composition which gives a thin film excellent in homogeneity.

The reducing agent to be used in the reduction treatment is not particularly limited as long as it is capable of reducing the quinoid structure into a non-oxidation-type structure, i.e. the benzenoid structure (for example, in the polythiophene derivative containing repeating units represented by the formula (1), converting the quinoid structure represented by the formula (1') into the structure represented by the formula (1)), and it is preferable to use, for example, ammonia water, hydrazine or the like. The amount of the reducing agent is preferably 0.1 to 10 parts by weight, more preferably 0.5 to 2 parts by weight, based on 100 parts by weight of the polythiophene derivative to be treated.

The method and conditions for reduction treatment are not particularly limited. For example, the treatment can be performed merely by bringing the polythiophene derivative into contact with the reducing agent with or without an appropriate solvent. Usually, reduction treatment under relatively mild conditions such as stirring of polythiophene in 28% ammonia water (e.g. overnight at room temperature) sufficiently improves the dispersibility of the polythiophene in an organic solvent.

In the case of sulfonated polythiophene, the sulfonated polythiophene may be subjected to reduction treatment after being converted into a corresponding ammonium salt, e.g. a trialkylammonium salt (sulfonated polythiophene amine adduct) if necessary.

The dispersibility of the polythiophene derivative in the solvent is changed by the reduction treatment, and as a result, the polythiophene derivative that was not dissolved in the reaction system at the start of the treatment may be dissolved at the time of completion of the treatment. In such a case, the polythiophene derivative can be recovered by, for example, a method in which an organic solvent incompatible with the polythiophene derivative (acetone, isopropyl alcohol or the like in the case of sulfonated polythiophene) is added to the reaction system to precipitate the polythiophene derivative, and filtration is performed.

The weight average molecular weight of the polythiophene derivative represented by the formula (1) is preferably about 1,000 to about 1,000,000, more preferably about 5,000 to about 100,000, still more preferably about 10,000 to about 50,000. When the weight average molecular weight is equal to or more than the lower limit, good electrical conductivity is obtained, and when the weight average molecular weight is equal to or less than the upper limit, solubility in a solvent is improved. The weight average molecular weight is a value measured by gel permeation chromatography and calculated in terms of polystyrene.

In the composition of the present invention, the polythiophene derivative containing repeating units represented by the formula (1) may be used singly, or used in the form of a combination of two or more compounds.

The polythiophene derivative containing repeating units represented by the formula (1) may be a commercialized product, or may be obtained by performing polymerization through a known method using a thiophene derivative or the like as a starting material. In any of the cases, it is preferable to use a polythiophene derivative purified by a method such as reprecipitation or ion exchange. Use of a purified polythiophene derivative enables further improvement of the characteristics of an OPV element including a thin film obtained from a composition containing the compound.

Note that sulfonation of sulfonated conjugated polymers and sulfonated conjugated polymers (including sulfonated polythiophenes) are described in U.S. Pat. No. 8,017,241 by Seshadri et al.

In addition, the sulfonated polythiophene is described in WO 2008/073149 and WO 2016/171935.

In the organic thin film solar cell, the ionization potential of the hole collection layer is preferably a value close to the ionization potential of a p-type semiconductor material in an active layer. The absolute value of the difference between the ionization potentials is preferably 0 to 1 eV, more preferably 0 to 0.5 eV, still more preferably 0 to 0.2 eV.

Therefore, the charge-transporting composition of the present invention may contain an electron-accepting dopant substance for the purpose of adjusting the ionization potential of a charge-transporting thin film obtained by use of the charge-transporting composition.

The electron-accepting dopant substance is not particularly limited as long as it is soluble in at least one solvent used.

[Chem. 10]

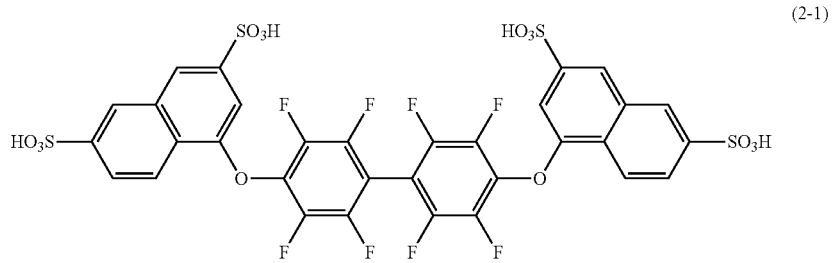

(2-1)

Specific examples of the electron-accepting dopant substance include inorganic strong acids such as hydrogen chloride, sulfuric acid, nitric acid and phosphoric acid; Lewis acids such as aluminum chloride (III) ($AlCl_3$), titanium tetrachloride (IV) ($TiCl_4$), boron tribromide ($BBr_3$), boron trifluoride ether complex ($BF_3$—$OEt_2$), iron chloride (III) ($FeCl_3$), copper chloride (II) ($CuCl_2$), antimony pentachloride (V) ($SbCl_5$), arsenic pentafluoride (V) ($AsF_5$), phosphorus pentafluoride ($PF_5$) and tris(4-bromophenyl)aluminum hexachloroantimonate (TBPAH); organic strong acids such as benzenesulfonic acid, tosylic acid, hydroxybenzenesulfonic acid, 5-sulfosalicylic acid, dodecylbenzenesulfonic acid, polystyrene sulfonic acid, the 1,4-benzodioxanedisulfonic acid compound described in WO 2005/000832, the naphthalene sulfonic acid compound described in WO 2006/025342, the arylsulfonic acid compounds such as dinonylnaphthalene sulfonic acid and 1,3,6-naphthalenetrisulfonic acid described in JP-A-2005-108828, and camphorsulfonic acid; organic oxidants such as 7,7,8,8-tetracyanoquinodimethane (TCNQ), 2,3-dichloro-5,6-dicyano-1,4-benzoquinone (DDQ) and iodine; and inorganic oxidants such as the heteropolyacid compounds such as phosphomolybdic acid, phosphotungstic acid and phosphotungstomolybdic acid described in WO 2010/058777. These compounds may be used singly, or in combination of two or more thereof.

In the present invention, among the various electron-accepting dopant substances, particularly Broensted acid that donates $H^+$ is preferable, arylsulfonic acid compounds are more preferable, and polystyrenesulfonic acid and arylsulfonic acid compounds represented by the following formula (2) are particularly preferable. Acid compounds are preferable.

[Chem. 9]

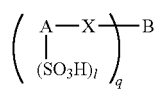

(2)

wherein X represents O, A represents a naphthalene ring or anthracene ring, B represents a divalent to tetravalent perfluorobiphenyl group, l represents the number of sulfonic acid groups bonded to A, and is an integer satisfying 1≤l≤4, and q represents the number of bonds between B and X, and is an integer of 2 to 4.

Examples of the arylsulfonic acid compound that can be suitably used in the present invention include the following compounds (formula (2-1)).

Further, the composition of the present invention contains a fluorine-based surfactant.

The fluorine-based surfactant is not particularly limited as long as it contains a fluorine atom, and may be cationic, anionic or nonionic, and a fluorine-based nonionic surfactant is suitable. In particular, at least one fluorine-based nonionic surfactant selected from compounds of the following formulae (A1) and (B1) is preferable.

[Chem. 11]

RCOO(CH₂CH₂O)ₙH     (A1)

R(CH₂CH₂O)ₙH     (B1)

In the above formulae, R represents a monovalent organic group containing a fluorine atom, and n represents an integer of 1 to 20.

Specific examples of the organic group include alkyl groups having 1 to 40 carbon atoms, aryl groups having 6 to 20 carbon atoms, aralkyl groups having 7 to 20 carbon atoms, and heteroaryl groups having 2 to 20 carbon atoms.

Specific examples of the aralkyl group having 7 to 20 carbon atoms include a benzyl group, a p-methylphenylmethyl group, an m-methylphenylmethyl group, an o-ethylphenylmethyl group, an m-ethylphenylmethyl group, a p-ethylphenylmethyl group, a 2-propylphenylmethyl group, a 4-isopropylphenylmethyl group, a 4-isobutylphenylmethyl group and an α-naphthylmethyl group.

Specific examples of the heteroaryl group include a 2-thienyl group, a 3-thienyl group, a 2-furanyl group, a 3-furanyl group, a 2-oxazolyl group, a 4-oxazolyl group, a 5-oxazolyl group, a 3-isooxazolyl group, a 4-isooxazolyl group, a 5-isooxazolyl group, a 2-thiazolyl group, a 4-thiazolyl group, a 5-thiazolyl group, a 3-isothiazolyl group, a 4-isothiazolyl group, a 5-isothiazolyl group, a 2-imidazolyl group, a 4-imidazolyl group, a 2-pyridyl group, a 3-pyridyl group, a 4-pyridyl group, a 2-pyrazyl group, a 3-pyrazyl group, a 5-pyrazyl group, a 6-pyrazyl group, a 2-pyrimidyl group, a 4-pyrimidyl group, a 5-pyrimidyl group, a 6-pyrimidyl group, a 3-pyridazyl group, a 4-pyridazyl group, a 5-pyridazyl group, a 6-pyridazyl group, a 1,2,3-triazin-4-yl group, a 1,2,3-triazin-5-yl group, a 1,2,4-triazin-3-yl group, a 1,2,4-triazin-5-yl group, a 1,2,4-triazin-6-yl group and a 1,3,5-triazin-2-yl group.

In addition, specific examples of the alkyl group and the aryl group include the same as those described above.

n is not particularly limited as long as it is an integer of 1 to 20, and an integer of 1 to 10 is more preferable.

Of these, at least one fluorine-based nonionic surfactant selected from a perfluoroalkyl polyoxyethylene ester represented by the following formula (A2) and a perfluoroalkyl polyoxyethylene ether or fluorotelomer alcohol represented by the formula (B2), each of which has a perfluoroalkyl group $R_f$ having 1 to 40 carbon atoms, is preferable.

[Chem. 12]

$$R_fCOO(CH_2CH_2O)_nH \quad (A2)$$

$$R_f(CH_2CH_2O)_nH \quad (B2)$$

wherein n represents the same meaning as described above.

Specific examples of the perfluoroalkyl group having 1 to 40 carbon atoms include groups in which all hydrogen atoms of the above-described alkyl group having 1 to 40 carbon atoms are replaced by fluorine atoms.

The fluorine-based surfactant for use in the present invention can be obtained as a commercialized product.

Examples of the commercialized product include, but are not limited to, Capstone (registered trademark) FS-10, FS-22, FS-30, FS-31, FS-34, FS-35, FS-50, FS-51, FS-60, FS-61, FS-63, FS-64, FS-65, FS-66, FS-81, FS-83 and FS-3100 manufactured by DuPont, Inc.; and NOIGEN FN-1287 manufactured by DKS Co., Ltd.

In particular, Capstone FS-30, 31, 34, 35 and 3100 and NOIGEN FN-1287, which are nonionic surfactants, are preferred.

In the composition of the present invention, the content of the fluorine-based surfactant is not particularly limited, and is preferably 0.05 to 10 wt %, more preferably 0.05 to 5.0 wt %, still more preferably 0.07 to 2.0 wt %, even more preferably 0.10 to 1.0 wt %, based on the total amount of the composition, from the viewpoint of a balance between improvement of film formability on the active layer and reduction of photoelectric conversion efficiency by addition.

Further, the composition of the present invention includes nanoparticles of one or more metal oxides. The term "nanoparticles" means fine particles in which primary particles have a mean particle size in the order of nanometers (typically 500 nm or less). The term "metal oxide nanoparticles" means a metal oxide formed into nanoparticles.

The primary particle size of metal oxide nanoparticles for use in the present invention is not particularly limited as long as it is a nanosize, and from the viewpoint of further enhancing adhesion with the active layer, the primary particle size is preferably 2 to 150 nm, more preferably 3 to 100 nm, still more preferably 5 to 50 nm. The particle size is a value measured by a BET method using a nitrogen adsorption isotherm.

The metal forming the metal oxide nanoparticles in the present invention includes semimetals in addition to metals in a normal sense.

The metal in a normal sense is not particularly limited, and it is preferable to use one or more selected from the group consisting of tin (Sn), titanium (Ti), aluminum (Al), zirconium (Zr), zinc (Zn), niobium (Nb), tantalum (Ta) and W (tungsten). On the other hand, the semimetal means an element having chemical and/or physical properties intermediate between a metal and a non-metal. Universal definition of semimetals has not been established, and in the present invention, a total of six elements: boron (B), silicon (Si), germanium (Ge), arsenic (As), antimony (Sb), and tellurium (Te) are semimetals. These semimetals may be used singly, or in combination of two or more thereof, or used in combination with metals in a normal sense.

Preferably, the metal oxide nanoparticles for use in the present invention contain an oxide of one or more metals selected from boron (B), silicon (Si), germanium (Ge), arsenic (As), antimony (Sb), tellurium (Te), tin (Sn), titanium (Ti), aluminum (Al), zirconium (Zr), zinc (Zn), niobium (Nb), tantalum (Ta) and W (tungsten). When the metal is a combination of two or more metals, the metal oxide may be a mixture of oxides of single metals or a complex oxide containing a plurality of metals.

Specific examples of the metal oxide include $B_2O_3$, $B_2O$, $SiO_2$, $SiO$, $GeO_2$, $GeO$, $As_2O_4$, $As_2O_3$, $As_2O_5$, $Sb_2O_3$, $Sb_2O_5$, $TeO_2$, $SnO_2$, $ZrO_2$, $Al_2O_3$ and $ZnO$, and $B_2O_3$, $B_2O$, $SiO_2$, $SiO$, $GeO_2$, $GeO$, $As_2O_4$, $As_2O_3$, $As_2O_5$, $SnO_2$, $SnO$, $Sb_2O_3$, $TeO_2$ and mixtures thereof are preferable, with $SiO_2$ being more preferable.

The metal oxide nanoparticles may contain one or more organic capping groups. The organic capping group may be reactive or non-reactive. Examples of the reactive organic capping group include organic capping groups that can be crosslinked by an ultraviolet ray or a radical initiator.

In the composition of the present invention, the compounding amount of the metal oxide nanoparticles is not particularly limited, and is preferably 50 to 95 wt %, more preferably 60 to 95 wt %, most preferably 80 to 95 wt %, based on the amount of the charge-transporting substance, from the viewpoint of sufficiently exhibiting adhesion with the active layer.

When the charge-transporting substance is used as a solution or a dispersion, the addition amount of the metal oxide nanoparticles is based on the amount of solid contents in the charge-transporting substance.

In particular, in the present invention, it is preferable to use silica sol in which $SiO_2$ nanoparticles are dispersed in a dispersion medium as the metal oxide nanoparticles.

The silica sol is not particularly limited, and may be appropriately selected from known silica sols.

Commercialized silica sol is normally in the form of a dispersion. Examples of the commercialized silica sol include silica sols with $SiO_2$ nanoparticles dispersed in various solvents, for example water, methanol, methyl ethyl ketone, methyl isobutyl ketone, N,N-dimethylacetamide, ethylene glycol, isopropanol, methanol, ethylene glycol monopropyl ether, cyclohexanone, ethyl acetate, toluene, propylene glycol monomethyl ether and acetate.

In particular, in the present invention, silica sol having an alcohol solvent or water as dispersion medium is preferable, and silica sol having an alcohol solvent as a dispersion medium is more preferable. The alcohol solvent is preferably a water-soluble alcohol, more preferably methanol, 2-propanol or ethylene glycol.

Specific examples of the commercialized silica sol include, but are not limited to, SNOWTEX (registered trademark) ST-O, ST-OS, ST-O-40 and ST-OL manufactured by Nissan Chemical Corporation; SLICADOL 20, 30, 40 and the like manufactured by Nippon Chemical Industrial Co., Ltd.; and Methanol Silica Sol and Organosilica Sol such as MA-ST-M, MA-ST-L, IPA-ST, IPA-ST-L, IPA-ST-ZL and EG-ST manufactured by Nissan Chemical Corporation.

The solid content concentration of the silica sol is also not particularly limited, and is preferably 5 to 60 wt %, more preferably 10 to 50 wt %, still more preferably 15 to 30 wt %.

In the composition of the present invention, the compounding amount of the silica sol is not particularly limited, and is preferably 50 to 95 wt %, more preferably 60 to 95 wt %, most preferably 80 to 95 wt %, based on the amount of the charge-transporting substance. In the present invention, when the compounding amount of the silica sol is within the above-described range, high transparency can be obtained, and adhesion with the active layer can be sufficiently exhibited.

The compounding amount is based on the amount of solid contents in the charge-transporting substance similarly to the above.

Further, the composition of the present invention may contain an alkoxysilane. When an alkoxysilane is contained, it is possible to improve the solvent resistance and the water resistance of the resulting thin film, improve the electron blocking property, and set the HOMO level and the LUMO level to optimal values for the active layer. The alkoxysilane may be a siloxane-based material.

As the alkoxysilane, any one or more of alkoxysilanes among tetraalkoxysilane, trialkoxysilane and dialkoxysilane can be used. In particular, tetraethoxysilane, tetramethoxysilane, phenyltriethoxysilane, phenyltrimethoxysilane, methyltriethoxysilane, methyltrimethoxysilane, 3,3,3-trifluoropropyltrimethoxysilane, dimethyldiethoxysilane and dimethyldimethoxysilane are preferable, with tetraethoxysilane being more preferable.

Examples of the siloxane-based material include polysiloxanes such as poly(tetraethoxysilane) and poly(phenylethoxysilane) which are obtained by reaction, such as hydrolysis, of the alkoxysilane.

The addition amount of the alkoxysilane is not particularly limited as long as it is an amount which allows the above-described effects to be exhibited, and the weight ratio of the alkoxysilane to the polythiophene derivative for use in the present invention is preferably 0.0001 to 100, more preferably 0.01 to 50, still more preferably 0.05 to 10.

The charge-transporting composition of the present invention may further contain a matrix polymer if necessary.

Specific examples of the matrix polymer include matrix polymers containing repeating units represented by the following formula (I) and repeating units represented by the following formula (II).

[Chem. 13]

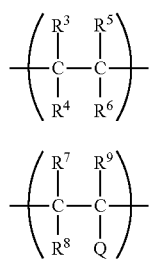

wherein $R^3$, $R^4$, $R^5$, $R^6$, $R^7$, $R^8$ and $R^9$ are each independently a hydrogen atom, a halogen atom, a fluoroalkyl group having 1 to 20 carbon atoms, or a perfluoroalkyl group having 1 to 20 carbon atoms, Q is $-[OC(R^hR^i)-C(R^jR^k)]_y-O-[CR^lR^m]_z-SO_3H$, $R^h$, $R^i$, $R^j$, $R^k$, $R^l$ and $R^m$ are each independently a hydrogen atom, a halogen atom, a fluoroalkyl group having 1 to 20 carbon atoms, or a perfluoroalkyl group having 1 to 20 carbon atoms, y is 0 to 10, and z is 1 to 5.

Specific examples of the halogen atom, the fluoroalkyl group having 1 to 20 carbon atoms and the perfluoroalkyl group having 1 to 20 carbon atoms include the same as those described above.

It is preferable that $R^3$, $R^4$, $R^5$ and $R^6$ are fluorine atoms or chlorine atoms, it is more preferable that $R^3$, $R^5$ and $R^6$ are fluorine atoms, and $R^4$ is a chlorine atom, and it is still more preferable that all of $R^3$, $R^4$, $R^5$ and $R^6$ are fluorine atoms.

Preferably, all of $R^7$, $R^8$ and $R^9$ are fluorine atoms.

Preferably, $R^h$, $R^i$, $R^j$, $R^k$, $R^l$ and $R^m$ are fluorine atoms, fluoroalkyl groups having 1 to 8 carbon atoms, or perfluoroalkyl groups having 1 to 8 carbon atoms.

More preferably, $R^l$ and $R^m$ are fluorine atoms. y is preferably 0, and z is preferably 2.

Preferably, $R^3$, $R^5$ and $R^6$ are fluorine atoms, $R^4$ is a chlorine atom, and each of $R^l$ and $R^m$ is a fluorine atom; y is 0; and z is 2.

Further, in certain embodiments, it is preferable that each of $R^3$, $R^4$, $R^5$ and $R^6$ is a fluorine atom; each of $R^l$ and $R^m$ is a fluorine atom; y is 0; and z is 2.

The ratio of the number of repeating units represented by the formula (I) "s" and the number of repeating units represented by the formula (II) "t" (s:t ratio) is not particularly limited. The s:t ratio is preferably 9:1 to 1:9, more preferably 8:2 to 2:8.

The matrix polymer that can be suitably used in the present invention may be one synthesized by a known method, or a commercialized product. For example, a polymer containing repeating units represented by the formula (I) and repeating units represented by the formula (II) can be produced by copolymerizing a monomer represented by the following formula (Ia) and a monomer represented by the following formula (IIa), and subsequently performing conversion into sulfonic acid groups by hydrolysis of sulfonyl fluoride groups.

[Chem. 14]

wherein $Q^1$ is $-[OC(R^hR^i)-C(R^jR^k)]_y-O-[CR^lR^m]_z-SO_2F$, and $R^3$, $R^4$, $R^5$, $R^6$, $R^7$, $R^8$, $R^9$, $R^h$, $R^i$, $R^j$, $R^k$, $R^l$, $R^m$, y and z have the same meanings as described above.

For example, tetrafluoroethylene (TFE) or chlorotrifluoroethylene (CTFE) can be copolymerized with one or more fluorinated monomers containing a sulfonic acid precursor group (e.g. $F_2C=CF-O-CF_2-CF_2-SO_2F$; $F_2C=CF-[O-CF_2-CR^{12}F-O]_y-CF_2-CF_2-SO_2F$ (wherein $R^{12}$ is F or $CF_3$, and y is 1 to 10); $F_2C=CF-O-CF_2-CF_2-CF_2-SO_2F$; or $F_2C=CF-OCF_2-CF_2-CF_2-CF_2-SO_2F$).

In the present invention, the equivalent amount of a matrix polymer means a weight of a matrix polymer per mol of acid groups present in the matrix polymer (g/mol). The equivalent amount of a matrix polymer is preferably about 400 to about 15,000 g/mol, more preferably about 500 to about 10,000 g/mol, still more preferably about 500 to about 8,000 g/mol, even more preferably about 500 to about 2,000 g/mol, most preferably about 600 to about 1,700 g/mol.

Such a matrix polymer can be obtained as a commercialized product.

Examples of the commercialized products include NAFION (registered trademark) manufactured by DuPont, Inc., AQUIVION (registered trademark) manufactured by Solvay Specialty Polymers, and FLEMION (registered trademark) manufactured by Asahi Glass Co., Ltd.

In the present invention, the matrix polymer is preferably polyether sulfone containing one repeating unit containing at least one sulfonic acid residue (—$SO_3H$).

The composition of the present invention may contain other additives as long as the object of the present invention can be achieved.

The types of additives can be appropriately selected from known additives according to a desired effect, and used.

As the solvent used for preparing the charge-transporting composition, a solvent having dissolving performance high enough to adequately dissolve the polythiophene derivative and the electron-accepting dopant substance can be used. Solvents having high dissolving performance can be used singly, or in combination of two or more thereof, and the use amount thereof may be 5 to 100 wt % based on the total amount of solvents used in the composition.

Examples of the solvent having high dissolving performance include water; alcohol-based solvents such as ethanol, 2-propanol, 1-butanol, 2-butanol, s-butanol, t-butanol, 1-methoxy-2-propanol; N-methylformamide, N,N-dimethylformamide, N,N-diethylformamide, N-methylacetamide, N,N-dimethylacetamide, N-methylpyrrolidone and 1,3-dimethyl-2-imidazolidinone.

Of these, at least one selected from water and the alcohol-based solvents is preferable, and water, ethanol and 2-propanol are more preferable.

In particular, the solvent to be used for formation of a hole collection layer of a reversely layered OPV is preferably a solvent composed only of one or more solvents selected from alcohol-based solvents and water which do not adversely affect the active layer.

It is preferable that both the charge-transporting substance and the electron-accepting dopant substance are completely dissolved or uniformly dispersed in the solvent, and it is more preferable that these substances are completely dissolved in the solvent from the viewpoint of reproducibly obtaining a hole collection layer which gives an organic thin-film solar cell having high conversion efficiency.

In addition, for improving film formability and the discharging property from a coating apparatus, the charge-transporting composition of the present invention may contain at least one high-viscosity organic solvent having a viscosity of 10 to 200 mPa·s, particularly 35 to 150 mPa·s, at 25° C., and a boiling point of 50 to 300° C., particularly 150 to 250° C., at normal pressure.

The high-viscosity organic solvent is not particularly limited, and examples thereof includes cyclohexanol, ethylene glycol, 1,3-octylene glycol, diethylene glycol, dipropylene glycol, triethylene glycol, tripropylene glycol, 1,3-butane diol, 2,3-butanediol, 1,4-butanediol, propylene glycol and hexylene glycol.

The addition ratio of the amount of the high-viscosity organic solvent to the total amount of solvents used in the composition of the present invention is preferably within the range of not causing precipitation of solids, and the addition ratio is preferably 5 to 80 wt % as long as solids are not precipitated.

Further, for the purpose of, for example, improving wettability with a coated surface, adjusting the surface tension of the solvent, adjusting the polarity and adjusting the boiling point, another solvent capable of imparting film flatness during heat treatment can be mixed in a ratio of 1 to 90 wt %, preferably 1 to 50 wt %, to the total amount of solvents used in the composition.

Examples of the solvent include butyl cellosolve, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, ethyl carbitol, diacetone alcohol, γ-butyrolactone, ethyl lactate and n-hexyl acetate.

The solid content concentration of the composition of the present invention is appropriately set in consideration of the viscosity and surface tension of the composition, the thickness of the thin film to be prepared, and is typically about 0.1 to 10.0 wt %, preferably 0.5 to 5.0 wt %, more preferably 1.0 to 3.0 wt %.

In addition, the weight ratio of the charge-transporting substance and the electron-accepting dopant substance is appropriately set in consideration of charge-transportability exhibited and the type of charge-transporting substance, and the amount of the electron-accepting dopant substance is typically 0 to 10, preferably 0.1 to 3.0, more preferably 0.2 to 2.0, as a relative value against the amount of the charge-transporting substance, which is defined as 1.

The viscosity of the charge-transporting composition for use in the present invention is appropriately adjusted depending on a coating method in consideration of the thickness of a thin film to be prepared and the solid content concentration, and is typically about 0.1 to 50 mPa·s at 25° C.

The charge-transporting substance, the fluorine-based surfactant, the metal oxide nanoparticles, the electron-accepting dopant substance, the solvent and the like can be mixed in any order as long as solid contents are uniformly dissolved or dispersed in the solvent in preparation of the charge-transporting composition of the present invention. That is, as long as solid contents are uniformly dissolved or dispersed in the solvent, for example, any of the following methods can be employed: a method in which the polythiophene derivative is dissolved in the solvent, and the electron-accepting dopant substance is then dissolved in the resulting solution; a method in which the electron-accepting dopant substance is dissolved in the solvent, and the polythiophene derivative is then dissolved in the resulting solution; a method in which the polythiophene derivative is mixed with the electron-accepting dopant substance, and the resulting mixture is then put in the solvent and dissolved.

The matrix polymer and the alkoxysilane may be added in any order.

In addition, preparation of the composition is typically performed in an inert gas atmosphere at normal temperature and normal pressure, but may be performed in an air atmosphere (in the presence of oxygen) or performed while heat is applied as long as compounds in the composition are not decomposed, or the composition does not significantly change.

The composition described above is applied to the anode in the case of a forward layered organic thin-film solar cell, or applied to the active layer in the case of a reversely layered organic thin-film solar cell, and baked to form the hole collection layer according to the present invention.

For the application of the composition, the most suitable method may be selected from various wet process methods such as a drop casting method, a spin coating method, a blade coating method, a dip coating method, a roll coating method, a bar coating method, a die coating method, an inkjet method, a printing method (e.g. letterpress, intaglio, lithography or screen printing) and the like in consideration of the viscosity and the surface tension of the composition, a desired thickness of the thin film, and the like.

In addition, application of the composition is typically performed in an inert gas atmosphere at normal temperature and normal pressure, but may be performed in an air atmosphere (in the presence of oxygen) or performed while heat is applied as long as compounds in the composition are not decomposed, or the composition does not significantly change.

The film thickness is not particularly limited, and in any case, the film thickness is preferably about 0.1 to 500 nm, more preferably about 1 to 100 nm. Methods for changing the film thickness include, for example, changing the solids concentration in the composition and changing the amount of solution at the time of application.

A method for producing an organic thin-film solar cell using the charge-transporting composition of the present invention as a composition for formation of a hole collection layer is described below, but other methods may be applied.

(1) Forward Layered Organic Thin-Film Solar Cell
[Formation of Anode Layer]:
Step of Forming Anode Material Layer on Surface of Transparent Substrate to Produce Transparent Electrode Examples of the anode material include inorganic oxides such as indium tin oxide (ITO) and indium zinc oxide (IZO), metals such as gold, silver and aluminum, and high-charge-transporting organic compounds such as polythiophene derivatives and polyaniline derivatives. Of these, ITO is most preferable. As the transparent substrate, a substrate composed of glass or transparent resin can be used.

The method for forming an anode material layer (anode layer) is appropriately selected according to the properties of the anode material. Typically, a dry process such as a vacuum evaporation method or a sputtering method is selected in the case of a hardly soluble or hardly dispersible sublimation material, and in the case of a solution material or a dispersion material, the most suitable method is selected from the above-described various wet process methods in consideration of the viscosity and the surface tension of the composition, a desired thickness of the thin film, and the like.

A commercialized transparent anode substrate can also be used. In this case, it is preferable to use a substrate subjected to a smoothing treatment from the viewpoint of improving the yield of the element. When a commercialized transparent anode substrate is used, the method for producing an organic thin-film solar cell according to the present invention does not include a step of forming an anode layer.

When an inorganic oxide such as ITO is used as an anode material to form a transparent anode substrate, it is preferable to wash the substrate with a detergent, alcohol, pure water or the like before stacking an upper layer. Further, it is preferable to subject the substrate to surface treatment such as UV ozone treatment or oxygen-plasma treatment immediately before use. Surface treatment need not be carried out in cases where the anode material contains an organic substance as a principal component.

[Formation of Hole Collection Layer]:
Step of Forming Hole Collection Layer on Formed Anode Material Layer In accordance with the above-described method, a hole collection layer is formed on the anode material layer by use of the composition of the present invention.

[Formation of Active Layer]:
Step of Forming Active Layer on Formed Hole Collection Layer The active layer may be a laminate of an n-layer which is a thin film composed of an n-type semiconductor material and a p-layer which is a thin film composed of a p-type semiconductor material, or the active layer may be a non-laminated thin film composed of a mixture of these materials.

Examples of the n-type semiconductor material include fullerene, [6,6]-phenyl-$C_{61}$-butyric acid methyl ester ($PC_{61}BM$), and [6,6]-phenyl-$C_{71}$-butyric acid methyl ester ($PC_{71}BM$). On the other hand, examples of the p-type semiconductor material, polymers containing a thiophene backbone as a main chain, such as regioregular poly(3-hexylthiophene) (P3HT), PTB7 represented by the following formula (4), thienothiophene unit-containing polymers as described in JP-A-2009-158921 and WO 2010/008672, phthalocyanines such as CuPC and ZnPC, and porphyrins such as tetrabenzoporphyrin.

[Chem. 15]

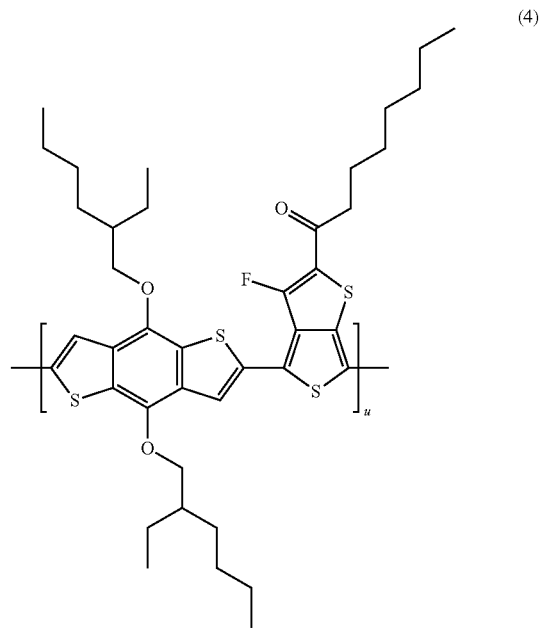

(4)

Of these, $PC_{61}BM$ and $PC_{71}BM$ are preferable as the n-type material, and polymers having a thiophene backbone as a main chain, such as PTB7, are preferable as the p-type material.

The term "thiophene backbone as a main chain" as used herein refers to a divalent aromatic ring composed only of thiophene, or a divalent fused aromatic ring containing one or more thiophenes, such as thienothiophene, benzothiophene, dibenzothiophene, benzodithiophene, naphthothiophene, naphthodithiophene, anthrathiophene and anthradithiophene. The aromatic ring may be substituted with a halogen atom, a nitro group, a cyano group, a sulfonic acid group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, an aralkyl group having 7 to 20 carbon atoms or an acyl group having 1 to 20 carbon atoms.

Examples of the halogen atom, the alkyl group having 1 to 20 carbon atoms, the alkoxy group having 1 to 20 carbon atoms, the aryl group having 6 to 20 carbon atoms, and the aralkyl group having 7 to 20 carbon atoms are the same as those described above.

Specific examples of the thioalkoxy group having 1 to 20 carbon atoms include groups in which the oxygen atom of the alkoxy group is replaced by a sulfur atom.

Specific examples of the thioalkoxy (alkylthio) group having 1 to 20 carbon atoms include a methylthio group, an ethylthio group, an n-propylthio group, an isopropylthio group, an n-butylthio group, an isobutylthio group, an s-butylthio group, a t-butylthio group, an n-pentylthio group, an n-hexylthio group, an n-heptylthio group, an n-octylthio group, an n-nonylthio group, an n-decylthio group, an n-undecylthio group, an n-dodecylthio group, an n-tridecylthio group, an n-tetradecylthio group, an n-pentadecylthio group, an n-hexadecylthio group, an n-heptadecylthio group, an-octadecylthio group, an n-nonadecylthio group and an n-eicosanylthio group.

Specific examples of the alkenyl group of having 2 to 20 carbon atoms include an ethenyl group, an n-1-propenyl group, an n-2-propenyl group, a 1-methylethenyl group, an n-1-butenyl group, an n-2-butenyl group, an n-3-butenyl group, a 2-methyl-1-propenyl group, a 2-methyl-2-propenyl group, a 1-ethylethenyl group, a 1 methyl-1-propenyl group, a 1-methyl-2-propenyl group, an n-1-pentenyl group, an n-1-decenyl group and an n-1-eicosenyl group.

Specific examples of the alkynyl group having 2 to 20 carbon atoms include an ethynyl group, an n-1-propynyl group, an n-2-propynyl group, an n-1-butynyl group, an n-2-butynyl group, an n-3-butynyl group, a 1-methyl-2-propynyl group, an n-1-pentynyl group, an n-2-pentynyl group, an n-3-pentynyl group, an n-4-pentynyl group, a 1-methyl-n-butynyl group, a 2-methyl-n-butynyl group, a 3-methyl-n-butynyl group, a 1,1-dimethyl-n-propynyl group, an n-1-hexynyl group, an n-1-decynyl group, an n-1-pentadecynyl group and an n-1-eicosynyl group.

Examples of the haloalkyl group having 1 to 20 carbon atoms include groups in which at least one of hydrogen atoms in the alkyl group is substituted with a halogen atom. The halogen atom may be any of chlorine, bromine, iodine and fluorine atoms. In particular, a fluoroalkyl group is preferable, and a perfluoroalkyl group is more preferable.

Specific examples thereof include a fluoromethyl group, a difluoromethyl group, a trifluoromethyl group, a pentafluoroethyl group, a 2,2,2-trifluoroethyl group, a heptafluoropropyl group, a 2,2,3,3,3-pentafluoropropyl group, a 2,2,3,3-tetrafluoropropyl group, a 2,2,2-trifluoro-1-(trifluoromethyl)ethyl group, a nonafluorobutyl group, a 4,4,4-trifluorobutyl group, an undecafluoropentyl group, a 2,2,3,3,4,4,5,5-nonafluoropentyl group, a 2,2,3,3,4,4,5,5-octafluoropentyl group, a tridecafluorohexyl group, a 2,2,3,3,4,4,5,5,6,6-undecafluorohexyl group, a 2,2,3,3,4,4,5,5,6,6-decafluorohexyl group and a 3,3,4,4,5,5,6,6,6-nonafluorohexyl group.

Examples of the acyl group having 1 to 20 carbon atoms include a formyl group, an acetyl group, a propionyl group, a butyryl group, an isobutyryl group, a valeryl group, an isovaleryl group and a benzoyl group.

For the method for forming an active layer, similarly to above, any of various dry processes as described above is selected in the case where the active layer material is a hardly soluble sublimation material, and in the case of a solution material or a dispersion material, the most suitable method is selected from the above-described various wet process methods in consideration of the viscosity and the surface tension of the composition, a desired thickness of the thin film, and the like.

[Formation of Electron Collection Layer]:
Step of Forming Electron Collection Layer on Formed Active Layer If necessary, an electron collection layer may be formed between the active layer and the cathode layer for the purpose of enhancing the efficiency of charge transfer.

Examples of the material for forming an electron collection layer include lithium oxide ($Li_2O$), magnesium oxide (MgO), alumina ($Al_2O_3$), lithium fluoride (LiF), sodium fluoride (NaF), magnesium fluoride ($MgF_2$), strontium bromide ($SrF_2$), cesium carbonate ($Cs_2CO_3$), 8-quinolinol lithium salt (Liq), 8-quinolinol sodium salt (Naq), bathocuproin (BCP), 4,7-diphenyl-1,10-phenanthroline (BPhen), polyethyleneimine (PEI) and ethoxylated polyethyleneimine (PEIE).

For the method for forming an electron collection layer, similarly to above, any of various dry processes as described above is selected in the case where the electron collection material is a hardly soluble sublimation material, and in the case of a solution material or a dispersion material, the most suitable method is selected from the above-described various wet process methods in consideration of the viscosity and the surface tension of the composition, a desired thickness of the thin film, and the like.

[Formation of Cathode Layer]:
Step of Forming Cathode Layer on Formed Electron Collection Layer Examples of the cathode material include metals such as aluminum, magnesium-silver alloys, aluminum-lithium alloys, lithium, sodium, potassium, cesium, calcium, barium, silver and gold, inorganic oxides such as indium tin oxide (ITO) and indium zinc oxide (IZO), and high-charge-transporting organic compounds such as polythiophene derivatives and polyaniline derivatives. The cathode material may be a laminate or mixture of a plurality of cathode materials.

For the method for forming a cathode layer, similarly to above, any of various dry processes as described above is selected in the case where the cathode layer material is a hardly soluble and hardly dispersible sublimation material, and in the case of a solution material or a dispersion material, the most suitable method is selected from the above-described various wet process methods in consideration of the viscosity and the surface tension of the composition, a desired thickness of the thin film, and the like.

[Formation of Carrier Blocking Layer]

If necessary, a carrier blocking layer may be provided between any layers for the purpose of controlling the rectification of photocurrents. When the carrier blocking layer is provided, typically but not exclusively, an electron blocking layer is inserted between the active layer and the hole collection layer or the anode, and a hole blocking layer is inserted between the active layer and the electron collection layer or the cathode.

Examples of the material for forming a hole blocking layer include titanium oxide, zinc oxide, tin oxide, bathocuproine (BCP), and 4,7-diphenyl-1,10-phenanthroline (BPhen).

Examples of the material for forming an electron blocking layer include N,N'-di(1-naphthyl)-N,N'-diphenylbenzidine (α-NPD), and triarylamine-based materials such as poly(triarylamine) (PTAA).

For the method for forming a carrier blocking layer, similarly to above, any of various dry processes as described above is selected in the case where the carrier blocking layer material is a hardly soluble and hardly dispersible sublimation material, and in the case of a solution material or a dispersion material, the most suitable method is selected from the above-described various wet process methods in consideration of the viscosity and the surface tension of the composition, a desired thickness of the thin film, and the like.

(2) Reversely Layered Organic Thin-Film Solar Cell
[Formation of Cathode Layer]:
Step of Forming Cathode Material Layer on Surface of Transparent Substrate to Produce Transparent Cathode Substrate Examples of the cathode material include those exemplified for the forward laminated anode material above, and fluorine-doped tin oxide (FTO), and examples of the transparent substrate include those exemplified for the forward laminated anode material above.

For the method for forming a cathode material layer (cathode layer), the above-described dry process is selected in the case where the cathode layer material is a hardly soluble and hardly dispersible sublimation material, and in the case of a solution material or a dispersion material, the most suitable method is selected from the above-described various wet process methods in consideration of the viscosity and the surface tension of the composition, a desired thickness of the thin film, and the like.

In this case, a commercialized transparent cathode substrate can be suitably used, and it is preferable to use a substrate subjected to a smoothing treatment from the viewpoint of improving the yield of the element. When a commercialized transparent cathode substrate is used, the method for producing an organic thin-film solar cell according to the present invention does not include a step of forming a cathode layer.

When a transparent cathode substrate is formed with an inorganic oxide used as a cathode material, the same washing treatment or surface treatment as in the case of the forward laminated anode material may be performed.

[Formation of Electron Collection Layer]:
Step of Forming Electron Collection Layer on Formed Cathode If necessary, an electron collection layer may be formed between the active layer and the cathode layer for the purpose of enhancing the efficiency of charge transfer.

Examples of the material for forming an electron collection layer include those exemplified for the forward laminated material above, zinc oxide (ZnO), titanium oxide (TiO) and tin oxide (SnO).

For the method for forming an electron collection layer, the above-described dry process is selected in the case where the cathode layer material is a hardly soluble and hardly dispersible sublimation material, and in the case of a solution material or a dispersion material, the most suitable method is selected from the above-described various wet process methods in consideration of the viscosity and the surface tension of the composition, a desired thickness of the thin film, and the like. A method may be employed in which a precursor layer of an inorganic oxide is formed on a cathode by using a wet process (particularly a spin coating method or a slit coating method), and then baked to form an inorganic oxide layer.

[Formation of Active Layer]:
Step of Forming Active Layer on Formed Electron Collection Layer The active layer may be a laminate of an n-layer which is a thin film composed of an n-type semiconductor material and a p-layer which is a thin film composed of a p-type semiconductor material, or the active layer may be a non-laminated thin film composed of a mixture of these materials.

Examples of the n-type and p-type semiconductor materials include the same as those exemplified for the forward laminated semiconductor material above. $PC_{61}BM$ and $PC_{71}BM$ are preferable as the n-type material, and polymers having a thiophene backbone as a main chain, such as PTB7, are preferable as the p-type material.

The method for forming an active layer is similar to the method described for the forward laminated active layer above.

[Formation of Hole Collection Layer]:
Step of Forming Hole Collection Layer on Formed Active Layer Material Layer In accordance with the above-described method, a hole collection layer is formed on the active layer material layer by use of the composition of the present invention.

[Formation of Anode Layer]:
Step of Forming Anode Layer on Formed Hole Collection Layer Examples of the anode material include the same as the above-described forward laminated anode material, and the method for forming the anode layer is the same as the method for forming the forward laminated cathode layer.

[Formation of Carrier Blocking Layer]

If necessary, a carrier blocking layer may be provided between any layers for the purpose of controlling the rectification of photocurrents as in the case of the forward laminated element.

The material for forming the hole blocking layer and the material for forming the electron blocking layer include the same as those described above, and the method for forming the carrier blocking layer is the same as described above.

The OPV element prepared by the method exemplified above can be introduced into a glove box again, sealed in an inert gas atmosphere of nitrogen or the like for prevention of degradation of the element by air, and caused to exhibit functions as a solar cell in a sealed state, or measurement for solar cell characteristics.

Examples of the sealing method include a method in which a concave glass substrate with an UV curable resin attached to an end thereof is attached to a film-formed surface of an organic thin-film solar cell element in an inert gas atmosphere, and the resin is cured by UV irradiation; and a method in which film sealing-type sealing is performed in vacuum by a technique such as sputtering.

The charge-transporting composition of the present invention is suitably used for formation of hole collection layers of organic photoelectric conversion elements and organic thin-film solar cells as described above, and can also be used for formation of charge-transporting thin films in electronic elements such as organic perovskite photoelectric conversion elements, organic electroluminescence elements, organic integrated circuits, organic field effect transistors, organic thin-film transistors, organic light emitting transistors, organic optical inspection devices, organic photoreceptors, organic field quenching elements, light emitting electrochemical cells, quantum dot light emitting diodes, quantum lasers, organic laser diodes and organic plasmon light emitting elements.

EXAMPLES

Examples and Comparative Examples are given below to more concretely illustrate the invention, although the invention is not limited by these Examples. The apparatuses used are as follows.
(1) Glove box:
  VAC Glove Box System manufactured by YAMAHACHI & CO., LTD.
(2) Vapor deposition apparatus:
  Vacuum Vapor Deposition Apparatus manufactured by Aoyama Engineering Co., Ltd.
(3) Solar simulator:
  OTENTOSUN-III (AM1.5G filter, radiation intensity: 100 mW/cm$^2$) manufactured by Bunkoukeiki Co., Ltd.
(4) Source measure unit:
  2612A manufactured by Keithley Instruments Co., Ltd.
(5) Thickness measuring apparatus:
  SURFCORDER ET-4000 manufactured by Kosaka Laboratory Ltd.
(6) Ultraviolet visible spectrophotometer:
  UV-3600 manufactured by Shimadzu Corporation
(7) Solar cell durability test system:
  SML-2K1AV4 manufactured by SERIC LTD.

[1] Preparation of Active Layer Composition

Preparation Example 1

2.0 mL of chlorobenzene was put in a sample bottle containing 20 mg of PTB7 (manufactured by 1-Material Co.) and 30 mg of PC$_{61}$BM (manufactured by Frontier Carbon Corporation, product name: nanom spectra E100), and the mixture was stirred on a hot plate at 80° C. for 15 hours. The resulting solution was allowed to cool to room temperature, 60 L of 1,8-diiodooctane (manufactured by Tokyo Chemical Industry Co., Ltd.) was then added, and the mixture was stirred to obtain a solution A1 (active layer composition).

[2] Production of Composition for Hole Collection Layer

Example 1-1

1.50 g of a PEDOT:PSS aqueous solution (Clevios P manufactured by Heraeus K.K., 1.3 wt % aqueous dispersion) was diluted with 7.86 g of distilled water, and 640 mg of SNOWTEX ST-O (manufactured by Nissan Chemical Corporation, 20.4 wt % aqueous dispersion) was added to prepare a dark blue solution with a concentration of 1.5 wt %. To the obtained dark blue solution was added a fluorine-based nonionic surfactant (FS-31 manufactured by DuPont, Inc., 25 wt % aqueous solution) in an amount of 0.13 wt % based on the total amount of the dark blue solution, and the mixture was filtered with a syringe filter with a pore size of 0.45 m to obtain a composition B1 for a hole collection layer.

Example 1-2

10.0 mg of a polythiophene derivative composed of repeating units represented by the formula (1-1) (hereinafter, referred to as S-poly(3-MEET)), which had been synthesized as described in U.S. Pat. No. 8,017,241, and 72.0 mg of a 5.0 wt % aqueous solution of an arylsulfonic acid compound A represented by the formula (2-1), which had been synthesized as described in WO 2006/025342, were dissolved in 2.71 g of distilled water, 255 mg of Organosilica Sol IPA-ST (manufactured by Nissan Chemical Corporation, 30.7 wt % IPA dispersion) and 2.96 g of isopropanol were added to prepare a dark blue solution with a concentration of 1.5 wt %. To the obtained dark blue solution was added a fluorine-based nonionic surfactant (FS-31 manufactured by DuPont, Inc., 25 wt % aqueous solution) in an amount of 0.13 wt % based on the total amount of the dark blue solution, and the mixture was filtered with a syringe filter with a pore size of 0.45 m to obtain a composition B2 for a hole collection layer.

Example 1-3

10.0 mg of S-Poly (3-MEET) and 72.0 mg of a 5.0 wt % aqueous solution of AQUIVISION (manufactured by Solvay, Ltd., 20.3 wt % aqueous solution) were dissolved in 2.71 g of distilled water, and 255 mg of Organosilica Sol IPA-ST (manufactured by Nissan Chemical Corporation, 30.7 wt % IPA dispersion) and 2.96 g of isopropanol were added to prepare a dark blue solution with a concentration of 1.5 wt %. To the obtained dark blue solution was added a fluorine-based nonionic surfactant (FS-31 manufactured by DuPont, Inc., 25 wt % aqueous solution) in an amount of 0.13 wt % based on the total amount of the dark blue solution, and the mixture was filtered with a syringe filter with a pore size of 0.45 m to obtain a composition B3 for a hole collection layer.

Example 1-4

2.00 g of a PEDOT:PSS aqueous solution (Clevios P manufactured by Heraeus K.K., 1.3 wt % aqueous dispersion) was diluted with 2.97 g of distilled water, and 31.9 mg of SNOWTEX ST-O (manufactured by Nissan Chemical Corporation, 20.4 wt % aqueous dispersion) was added to prepare a dark blue solution with a concentration of 0.65 wt %. To the obtained dark blue solution was added a fluorine-based nonionic surfactant (FS-31 manufactured by DuPont, Inc., 25 wt % aqueous solution) in an amount of 0.25 wt % based on the total amount of the dark blue solution, and the mixture was filtered with a syringe filter with a pore size of 0.45 m to obtain a composition B4 for a hole collection layer.

Example 1-5

1.25 g of a PEDOT:PSS aqueous solution (Clevios P manufactured by Heraeus K.K., 1.3 wt % aqueous dispersion) was diluted with 3.67 g of distilled water, and 79.7 mg of SNOWTEX ST-O (manufactured by Nissan Chemical Corporation, 20.4 wt % aqueous dispersion) was added to prepare a dark blue solution with a concentration of 0.65 wt %. To the obtained dark blue solution was added a fluorine-based nonionic surfactant (FS-31 manufactured by DuPont, Inc., 25 wt % aqueous solution) in an amount of 0.25 wt % based on the total amount of the dark blue solution, and the mixture was filtered with a syringe filter with a pore size of 0.45 m to obtain a composition B5 for a hole collection layer.

Example 1-6

0.50 g of a PEDOT:PSS aqueous solution (Clevios P manufactured by Heraeus K.K., 1.3 wt % aqueous dispersion) was diluted with 4.37 g of distilled water, and 128 mg of SNOWTEX ST-O (manufactured by Nissan Chemical Corporation, 20.4 wt % aqueous dispersion) was added to prepare a dark blue solution with a concentration of 0.65 wt %. To the obtained dark blue solution was added a fluorine-based nonionic surfactant (FS-31 manufactured by DuPont, Inc., 25 wt % aqueous solution) in an amount of 0.25 wt % based on the total amount of the dark blue solution, and the mixture was filtered with a syringe filter with a pore size of 0.45 m to obtain a composition B6 for a hole collection layer.

Comparative Example 1-1

To a dark blue solution obtained by diluting 15 g of a PEDOT:PSS (Clevios P manufactured by Heraeus K.K., 1.3 wt % aqueous dispersion) with 15 g of distilled water, a fluorine-based nonionic surfactant (FS-31 manufactured by DuPont, Inc., 25 wt % aqueous solution) was added in an amount of 0.25 wt % based on the total amount of the dark blue solution, and the mixture was filtered with a syringe filter with a pore size of 0.45 m to obtain a composition C1 for a hole collection layer.

[3] Preparation of Adhesion Test Laminate

Example 2-1

A 20 mm×20 mm glass substrate with an ITO transparent conductive layer was subjected to UV/ozone treatment for 15 minutes. A zinc oxide solution (manufactured by Genes' Ink) for forming an electron collection layer was dropped onto the substrate, and film formation was performed by a spin coating method. The thickness of the electron collection layer was about 20 nm. Thereafter, in a glove box filled with an inert gas, the solution A1 obtained in Preparation Example 1 was dropped onto the formed electron collection layer, and a film formation was performed by a spin coating method to form an active layer.

Next, the composition B1 for a hole collection layer, which had been prepared in Example 1-1, was applied onto the active layer by a spin coating method, and then dried at room temperature to form a hole collection layer. The thickness of the hole collection layer was about 20 nm.

Example 2-2

An adhesion test laminate was prepared in the same manner as in Example 2-1 except that after the composition B1 for a hole collection layer was applied by a spin coating method, annealing treatment was performed with a hot plate at 60° C. for 30 minutes, and then at 80° C. for 10 minutes.

Example 2-3

An adhesion test laminate was prepared in the same manner as in Example 2-2 except that a composition B2 for a hole collection layer was used instead of the composition B1 for a hole collection layer.

Example 2-4

An adhesion test laminate was prepared in the same manner as in Example 2-2 except that a composition B3 for a hole collection layer was used instead of the composition B1 for a hole collection layer.

Example 2-5

An adhesion test laminate was prepared in the same manner as in Example 2-2 except that a composition B6 for a hole collection layer was used instead of the composition B1 for a hole collection layer.

Comparative Example 2-1

An adhesion test laminate was prepared in the same manner as in Example 2-1 except that a composition C1 for a hole collection layer was used instead of the composition B1 for a hole collection layer.

Comparative Example 2-2

An adhesion test laminate was prepared in the same manner as in Example 2-2 except that a composition C1 for a hole collection layer was used instead of the composition B1 for a hole collection layer.

[4] Adhesion Test

A peeling test was conducted on the laminates prepared in Examples 2-1 to 2-5 and Comparative Examples 2-1 to 2-2. The peeling test was performed in accordance with JIS K 5600-5-6. In a film to be evaluated, six cuts were made at intervals of 2 mm in longitudinal and lateral directions, a cellophane tape having a width of 18 mm and an adhesive strength of 4N/cm was attached to the film surface, and peeled in a direction of about 60°. The degree of adhesion between the substrate surface and the cellophane tape surface after peeling was visually observed to perform evaluation of adhesion. The results are shown in Table 1.

TABLE 1

|  | Annealing | Peeling test |
| --- | --- | --- |
| Example 2-1 | not done | peeled by 35% |
| Example 2-2 | done | not peeled |
| Example 2-3 | done | peeled by 5% |
| Example 2-4 | done | peeled by 5% |
| Example 2-5 | done | peeled by 5% |
| Comparative Example 2-1 | not done | peeled by 100% |
| Comparative Example 2-2 | done | peeled by 100% |

As shown in Table 1, use of the composition for a hole collection layer according to the present invention enables significant improvement of adhesion with the active layer, and in particular, the adhesion is improved by performing annealing treatment.

[5] Preparation of Organic Thin-Film Solar Cell

Example 3-1

A 20 mm×20 mm glass substrate in which an ITO transparent conductive layer as a cathode was patterned in a 2 mm×20 mm stripe shape was subjected to UV/ozone treatment for 15 minutes. A zinc oxide solution (manufactured by Genes' Ink) for forming an electron collection layer was dropped onto the substrate, and film formation was performed by a spin coating method. The thickness of the electron collection layer was about 20 nm. Thereafter, in a glove box filled with an inert gas, the solution A1 obtained in Preparation Example 1 was dropped onto the formed electron collection layer, and a film formation was performed by a spin coating method to form an active layer.

Next, the composition B1 for a hole collection layer, which had been prepared in Example 1-1, was applied onto the active layer by a spin coating method, and then dried at room temperature to form a hole collection layer. The thickness of the hole collection layer was about 20 nm.

Finally, the laminated substrate was placed in a vacuum vapor deposition apparatus, and the apparatus was evacuated until the degree of vacuum in the apparatus was $1\times10^{-3}$ Pa or less, and by a resistance heating method, a silver layer as an anode was formed to a thickness of 80 nm to prepare a reversely layered OPV element in which the area of an intersection of the striped ITO layer and the silver layer was 2 mm×2 mm. Further, the element was heated with a hot plate at 60° C. for 30 minutes to perform annealing treatment.

Example 3-2 to 3-6

Reversely layered OPV elements were prepared in the same manner as in Example 3-1 except that the compositions B2 to B6 for hole collection layers which had been obtained in Examples 1-2 to 1-6, respectively, were used instead of the composition B1 for a hole collection layer.

[6] Evaluation of Characteristics

For the OPV elements prepared in Examples 3-1 to 3-6, the short-circuit current density (Jsc [mA/cm$^2$]), open circuit voltage (Voc [V]), fill factor (FF) and PCE [%] were evaluated. The results are shown in Table 2.

PCE [%] was calculated from the following expression.

$PCE$ [%]=$J_{SC}$ [mA/cm$^2$]×$V_{OC}$ [V]×$FF$÷incident light intensity (100 [mW/cm$^2$])×100

TABLE 2

|  | $J_{sc}$ (mA/cm$^2$) | $V_{oc}$ (V) | FF | PCE (%) |
|---|---|---|---|---|
| Example 3-1 | 13.1 | 0.68 | 0.55 | 4.9 |
| Example 3-2 | 12.8 | 0.73 | 0.58 | 5.4 |
| Example 3-3 | 12.9 | 0.67 | 0.59 | 5.1 |
| Example 3-4 | 11.5 | 0.77 | 0.50 | 4.5 |
| Example 3-5 | 12.0 | 0.75 | 0.46 | 4.2 |
| Example 3-6 | 12.3 | 0.73 | 0.44 | 3.9 |

As shown in Table 2, use of the composition for a hole collection layer according to the present invention enables production of a reversely layered OPV element having good hole-transporting characteristics (HTL characteristics).

[7] Preparation of Thin Film for Measurement of Transmittance

Example 4-1

A 25 mm×25 mm quartz substrate was subjected to UV/ozone treatment for 15 minutes. The composition B1 for a hole collection layer, which had been prepared in Example 1-1, was applied to the substrate by a spin coating method, and then dried at room temperature to prepare a hole collection layer thin film. The film thickness was about 30 nm.

Comparative Example 4-1

A thin film for measurement of transmittance was prepared in the same manner as in Example 4-1 except that a composition C1 for a hole collection layer was used instead of the composition B1 for a hole collection layer. The film thickness was about 30 nm.

[8] Measurement of Transmittance

For the thin films prepared in Example 4-1 and Comparative Example 4-1, the spectral transmittance over a wavelength range from 380 nm to 900 nm in accordance with JIS R 3106:1998. The measurement results are shown in FIG. 1. The evaluation results are shown as average values in Table 3.

TABLE 3

|  | Transmittance (%) |
|---|---|
| Example 4-1 | 99.6 |
| Comparative Example 4-1 | 97.4 |

As shown in Table 3, use of the composition for a hole collection layer according to the present invention enables formation of a thin film having higher transparency.

[9] Light Resistance Test

Example 5-1 to 5-3

The OPV elements prepared in Examples 3-4 to 3-6 were irradiated with artificial solar light at an illumination intensity of 100 mW/cm$^2$ for 24 hours after initial PCE was measured in a solar cell durability test system (SML-2K1AV4 manufactured by SERIC LTD.) using a 2,000 W metal halide lamp. For each OPC element after irradiation with the artificial solar light, PCE was measured, and the PCE retention was calculated from the following calculation formula. Table 4 shows initial PCE, PCE after irradiation with artificial solar light, and PCE retentions.

$PCE$ retention (%)=$PCE$ after irradiation with artificial solar light initial $PCE$×100

Comparative Example 5-1

A reversely layered OPV element was prepared in the same manner as in Example 3-1 except that the composition C1 for a hole collection layer which had been obtained in Comparative Example 1-1 was used instead of the composition B1 for a hole collection layer. For the OPV element, a light resistance test was conducted in the same manner as in Examples 5-1 to 5-3.

TABLE 4

|  | Initial PCE (%) | PCE after irradiation with artificial solar light (%) | PCE retention (%) |
|---|---|---|---|
| Example 5-1 | 4.3 | 2.4 | 55 |
| Example 5-2 | 4.2 | 3.3 | 78 |
| Example 5-3 | 3.7 | 2.9 | 79 |
| Comparative Example 5-1 | 4.5 | 2.3 | 47 |

As shown in Table 4, it is apparent that the OPV elements produced by use of the composition of the present invention

The invention claimed is:

1. A charge-transporting composition comprising: a charge-transporting substance including a polythiophene derivative containing repeating units represented by the formula (1); a fluorine-based surfactant; metal oxide nanoparticles; an electron-accepting dopant substance different from the polythiophene derivative containing repeating units represented by the formula (1); and a solvent:

[Chem. 1]

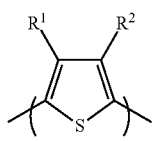
(1)

wherein $R^1$ and $R^2$ are each independently a hydrogen atom, an alkyl group having 1 to 40 carbon atoms, a fluoroalkyl group having 1 to 40 carbon atoms, an alkoxy group having 1 to 40 carbon atoms, a fluoroalkoxy group having 1 to 40 carbon atoms, an aryloxy group having 6 to 20 carbon atoms, —O—[Z—O]$_p$—$R^e$, or a sulfonic acid group, or $R^1$ and $R^2$ are combined to form —O—Y—O—, Y is an alkylene group having 1 to 40 carbon atoms, optionally containing an ether bond and optionally substituted with a sulfonic acid group, and Z is an alkylene group having 1 to 40 carbon atoms and optionally substituted with a halogen atom, p is 1 or more, and $R^e$ is a hydrogen atom, an alkyl group having 1 to 40 carbon atoms, a fluoroalkyl group having 1 to 40 carbon atoms, or an aryl group having 6 to 20 carbon atoms;
wherein the metal oxide nanoparticles are $SiO_2$;
wherein $SiO_2$ is silica sol;
wherein the electron-accepting dopant substance is an arylsulfonic acid compound; and
wherein an amount of the metal oxide nanoparticles is 50 to 95 wt % based on the amount of the charge transporting substance.

2. The charge-transporting composition according to claim 1, wherein the fluorine-based surfactant is a fluorine-based nonionic surfactant.

3. The charge-transporting composition according to claim 2, wherein the fluorine-based nonionic surfactant is at least one selected from compounds of the following formulae (A2) and (B2):

[Chem. 2]

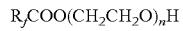 (A2)

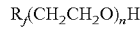 (B2)

wherein $R_f$ is each independently represent a perfluoroalkyl group having 1 to 40 carbon atoms, and n is each independently represent an integer of 1 to 20.

4. The charge-transporting composition according to claim 1, wherein $R^1$ is a sulfonic acid group, $R^2$ is an alkoxy group having 1 to 40 carbon atoms or —O—[Z—O]$_p$—$R^e$, or $R^1$ and $R^2$ are combined to form —O—Y—O—.

5. The charge-transporting composition according to claim 1, wherein the solvent contains one or more solvents selected from an alcohol-based solvent and water.

6. The charge-transporting composition according to claim 1 wherein the charge-transporting composition is one for a hole collection layer of an organic photoelectric conversion element.

7. The charge-transporting composition according to claim 6, wherein the organic photoelectric conversion element is an organic thin-film solar cell, a dye-sensitized solar cell or an optical sensor.

8. A thin film obtained from the charge-transporting composition of claim 1.

9. An electronic element comprising the thin film of claim 8.

10. The electronic element according to claim 9, wherein the electronic element is an organic photoelectric conversion element.

11. The thin film according to claim 8, wherein the thin film is a hole collection layer of an organic photoelectric conversion element.

12. An organic photoelectric conversion element comprising the hole collection layer of claim 11, and an active layer provided so as to contact the hole collection layer.

13. The organic photoelectric conversion element according to claim 12, wherein the active layer contains a fullerene derivative.

14. The organic photoelectric conversion element according to claim 12, wherein the active layer contains a polymer containing a thiophene backbone as a main chain.

15. The organic photoelectric conversion element according to claim 12, wherein the active layer contains a fullerene derivative, and a polymer containing a thiophene backbone as a main chain.

16. The organic photoelectric conversion element according to claim 12, which is a reversely layered organic photoelectric conversion element.

17. The organic photoelectric conversion element according to claim 12, wherein the organic photoelectric conversion element is an organic thin-film solar cell or an optical sensor.

18. The organic photoelectric conversion element according to claim 17, which has a top anode structure.

19. A composition for a hole collection layer of an organic photoelectric conversion element, comprising: a charge-transporting substance including a polythiophene derivative containing repeating units represented by the formula (1); metal oxide nanoparticles, an electron-accepting dopant substance different from the polythiophene derivative containing repeating units represented by the formula (1); and a solvent:

[Chem. 3]

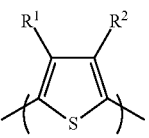
(1)

wherein $R^1$ and $R^2$ are each independently a hydrogen atom, an alkyl group having 1 to 40 carbon atoms, a fluoroalkyl group having 1 to 40 carbon atoms, an alkoxy group having 1 to 40 carbon atoms, a fluoroalkoxy group having 1 to 40 carbon atoms, an aryloxy group having 6 to 20 carbon atoms, —O—[Z—O]$_p$—$R^e$ or a sulfonic acid group, or $R^1$ and $R^2$ are combined to form —O—Y—O—, Y is an alkylene group having 1 to 40 carbon atoms, optionally containing an ether bond and optionally substituted with a sulfonic acid group, and Z is an alkylene group having 1 to 40 carbon atoms and optionally substituted with a halogen atom, p is 1 or more, and $R^e$ is a hydrogen atom, an alkyl group having 1 to 40 carbon atoms, a fluoroalkyl group having 1 to 40 carbon atoms, or an aryl group having 6 to 20 carbon atoms;

wherein the metal oxide nanoparticles are $SiO_2$;

wherein $SiO_2$ is silica sol;

wherein the electron-accepting dopant substance is an arylsulfonic acid compound; and wherein an amount of the metal oxide nanoparticles is 50 to 95 wt % based on the amount of the charge transporting substance.

20. A hole collection layer obtained from the composition for a hole collection layer of an organic photoelectric conversion element in claim 19.

21. An organic photoelectric conversion element comprising the hole collection layer of claim 20.

* * * * *